US007253654B2

(12) United States Patent
Amin

(10) Patent No.: US 7,253,654 B2
(45) Date of Patent: Aug. 7, 2007

(54) SUPERCONDUCTING QUBITS HAVING A PLURALITY OF CAPACITIVE COUPLINGS

(75) Inventor: Mohammad H. S. Amin, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 5 days.

(21) Appl. No.: 11/267,459

(22) Filed: Nov. 4, 2005

(65) Prior Publication Data

US 2006/0097746 A1 May 11, 2006

Related U.S. Application Data

(60) Provisional application No. 60/626,409, filed on Nov. 8, 2004.

(51) Int. Cl.
*H03K 19/195* (2006.01)
(52) U.S. Cl. .......................... 326/3; 327/186; 327/367; 327/528; 365/162
(58) Field of Classification Search ................ 326/1–7; 327/186, 366–367, 527–528
See application file for complete search history.

(56) References Cited

U.S. PATENT DOCUMENTS

| 4,370,359 | A | 1/1983 | Fetter et al. | |
| 6,670,630 | B2 | 12/2003 | Blais et al. | |
| 6,838,694 | B2 | 1/2005 | Esteve et al. | |
| 6,900,454 | B2 * | 5/2005 | Blais et al. | 257/14 |
| 6,930,318 | B2 | 8/2005 | Vion et al. | |
| 6,930,320 | B2 * | 8/2005 | Blais et al. | 257/31 |
| 2005/0082519 | A1 | 4/2005 | Amin et al. | |

OTHER PUBLICATIONS

Amin, M.H.S., 2003, "Charge-Phase Qubit in Phase Regime," arXiv.org:cond-mat/0311220.
Averin, D.V., 2002, "Quantum nondemolition measurements of a qubit," arXiv.org:cond-mat/0202082.
Berkley, A.J., 2003, "A Josephson Junction Qubit," Thesis, University of Maryland at College Park, pp. 76-87.
Blatter, G., V.B. Geshkenbein, L.B. Ioffe, 2001, "Design aspects of superconducting-phase quantum bits," Phys. Rev. B 63, 174511.

(Continued)

*Primary Examiner*—Rexford Barnie
*Assistant Examiner*—Jason Crawford
(74) *Attorney, Agent, or Firm*—Seed IP Law Group PLLC

(57) ABSTRACT

A first qubit having a superconducting loop interrupted by a plurality of Josephson junctions is provided. Each junction interrupts a different portion of the superconducting loop and each different adjacent pair of junctions in the plurality of Josephson junctions defines a different island. An ancillary device is coupled to the first qubit. In a first example, the ancillary device is a readout mechanism respectively capacitively coupled to a first and second island in the plurality of islands of the first qubit by a first and second capacitance. Quantum nondemolition measurement of the first qubit's state may be performed. In a second example, the ancillary device is a second qubit. The second qubit's first and second islands are respectively capacitively coupled to the first and second islands of the first qubit by a capacitance. In this second example, the coupling is diagonal in the physical basis of the qubits.

20 Claims, 6 Drawing Sheets

OTHER PUBLICATIONS

Born, D., T. Wagner, W. Krech, U. Hübner, L. Fritzsch, 2001, "Fabrication of Ultrasmall Tunnel Junctions by Electron Beam Direct-Writing," IEEE Trans. Appl. Supercond. 11, 373.

Braginsky, V.B., F.Y. Khalili, 1996, "Quantum nondemolition measurements: the route from toys to tools," Rev. Mod. Phys. 68, pp. 1-11.

Caves, C.M., K.S. Thorne, R.W.P. Drever, V.D. Sandberg, M. Zimmerman, 1980, "On the measurement of a weak classical force coupled to a quantum-mechanical oscillator. I. Issues of principle," Rev. Mod. Phys. 52, pp. 341-392.

Devoret, M.H., R.J. Schoelkopf, 2000, "Amplifying quantum signals with the single-electron transistor," Nature 406, pp. 1039-1046.

Deutsch, D., 1985, "Quantum theory, the Church-Turing principle and the universal quantum computer," Proc. Roy. Soc. Lond. A 400, p. 97.

Dolan, G.J., 1977, "Offset masks for lift-off photoprocessing," Appl. Phys. Lett. 31, pp. 337-339.

Duty, T., D. Gunnarsson, K. Bladh, P. Delsing, 2004, "Coherent dynamics of a Josephson charge qubit," Phys. Rev. B 69, 140503.

Feynmann, R.P., 1982, "Simulating Physics with Computers," Int. Journ. Theor. Phys. 21, pp. 467-488.

Friedman, J.R., V. Patel, W. Chen, S.K. Tolpygo, J.E. Lukens, 2000, "Quantum superposition of distinct macroscopic states," Nature 406, pp. 43-46.

Fulton, T.A., G.J. Dolan, 1987, "Observation of Single-Electron Charging Effects in Small Tunnel Junctions," Phys. Rev. Lett. 59, pp. 109-112.

Grangier, P., J.A. Levenson, J.P. Poizat, 1998, "Quantum non-demolition measurements in optics," Nature 396, pp. 537-542.

Guillaume, A., J.F. Schneiderman, P. Delsing, H.M. Bozler, P.M. Echternach, 2004, "Free evoluation of superposition states in a single Cooper pair box," Phys. Rev. B 69, 132504.

Il'ichev, E., N. Oukhanski, A. Izmalkov, T. Wagner, M. Grajcar, H.-G. Meyer, A.Y. Smirnov, A. Maassen van den Brink, M.H.S. Amin, A.M. Zagoskin, 2003, "Continuous Monitoring of Rabi Oscillations in a Josephson Flux Qubit," Phys. Rev. Lett. 91, 097906.

Jordan, A.N., M. Büttiker, 2004, "Quantum Nondemolition Measurement of a Kicked Qubit," arXiv.org:cond-mat/0406529.

Korotkov, A.N., D.V. Averin, 2001, "Continuous weak measurement of quantum coherent oscillations," Phys. Rev. B 64, 165310.

Koval, Y., A. Wallraff, M. Fistul, N. Thyssen, H. Kohlstedt, A.V. Ustinov, 1999, "Narrow Long Josephson Junctions," IEEE Trans. Appl. Supercond. 9, 3957.

Majer, J.B., 2002, "Superconducting Quantum Circuits," Thesis, Delft University of Technology, pp. 12-13.

Makhlin, Y., G. Schön, A. Shnirman, 2001, "Quantum-state engineering with Josephson-junction devices," Rev. Mod. Phys. 73, pp. 357-400.

Mooij, J.E., T.P. Orlando, L. Levitov, L. Tian, C.H. van der Wal, S. Lloyd, 1999, "Josephson Persistent-Current Qubit," Science 285, pp. 1036-1039.

Nakamura, Y., Y.A. Pashkin, J.S. Tsai, 1999, "Coherent control of macroscopic quantum states in a single-Cooper-pair box," Nature 398, pp. 786-788.

Orlando, T.P., J.E. Mooij, L. Tian, C.H. van der Wal, L.S. Levitov, S. Lloyd, J.J. Mazo, 1999, "Superconducting persistent-current qubit," Phys. Rev. B 60, 15398.

Paauw, F.G., 2002, "Spectroscopy experiments on two coupled Josephson persistent current qubits," Thesis, Delft University of Technology, pp. 34-36, 58-60.

Peil, S., G. Gabrielse, 1999, "Observing the Quantum Limit of an Electron Cyclotron: QND Measurements of Quantum Jumps between Fock States," Phys. Rev. Lett. 83, pp. 1287-1290.

Pryde, G.J., J.L. O'Brien, A.G. White, S.D. Bartlett, T.C. Ralph, 2004, "Measuring a Photonic Qubit without Destroying It," Phys. Rev. Lett. 92, 190402.

Schoelkopf, R.J., P. Wahlgren, A.A. Kozhevnikov, P. Delsing, D.E. Prober, 1998, "The Radio-Frequency Single-Electron Transistor (RF-SET): A Fast and Ultrasensitive Electrometer," Science 280, pp. 1238-1242.

Travaglione, B.C., G.J. Milburn, T.C. Ralph, 2002, "Phase estimation as a quantum nondemolition measurement," arXiv.org:quant-ph/0203130.

Vion, D., A. Aassime, A. Cottet, P. Joyez, H. Pothier, C. Urbina, D. Esteve, M.H. Devoret, 2002, "Manipulating the Quantum State of an Electrical Circuit," Science 296, pp. 886-889.

Inokuchi, T. et al., "Analog Computation using Quantum-Flux Parametron Devices," Physica C,, 357-360, pp. 1618-1621, Department of Electrical Engineering, Hokkaido University, Kita 13, Nishi-8, Sapporo 060-8628, Japan, Jan. 12, 2001.

* cited by examiner

SUPERCONDUCTING QUBITS HAVING A PLURALITY OF CAPACITIVE COUPLINGS

CROSS REFERENCE TO RELATED APPLICATIONS

This application claims benefit, under 35 U.S.C. § 119(e), of U.S. Provisional Patent Application No. 60/626,409, filed on Nov. 8, 2004, which is hereby incorporated by reference in its entirety.

1. FIELD OF THE INVENTION

This invention relates to the field of quantum computing and to the field of superconducting devices.

2. BACKGROUND

Research on what is now called quantum computing was noted by Richard Feynman. See Feynman, 1982, International Journal of Theoretical Physics 21, pp. 467-488, which is hereby incorporated by reference in its entirety. Feynman observed that quantum systems are inherently difficult to simulate with conventional computers but that observing the evolution of an analogous quantum system could provide an exponentially faster way to solve the mathematical model of a system. In particular, solving a model for the behavior of a quantum system commonly involves solving a differential equation related to the Hamiltonian of the quantum system. David Deutsch observed that a quantum system could be used to yield a time savings, later shown to include exponential time savings, in certain computations. If one had a problem, modeled in the form of an equation that represented the Hamiltonian of the quantum system, the behavior of the system could provide information regarding the solutions to the equation. See Deutsch, 1985, Proceedings of the Royal Society of London A 400, pp. 97-117, which is hereby incorporated by reference in its entirety.

One limitation in the quantum computing art is the identification of systems that can support quantum computation. As detailed in the following sections, a qubit, which is analogous to a "bit" of a classical digital computer, serves as the basis for performing quantum computation. However, in order to perform such quantum computations, qubits must be able to retain their quantum behavior for a sufficient period of time. The loss of quantum behavior is referred to as decoherence. Further, techniques for reading the state of qubits are needed in order to determine the result of a quantum computation. Ideally, such readout mechanisms do not introduce a source of decoherence to the quantum computing system.

The computing power of quantum devices increases as the basic building blocks of a quantum computer, qubits, are coupled together in such a way that the quantum state of one qubit affects the quantum state of each of the qubits to which it is coupled. There is a form of coupling referred to as entanglement, in qubits are not physically connected to each other yet their states are highly correlated. Another limitation in the quantum computing art is the identification of methods that can be used to controllably entangle the states of qubits without introducing a significant source of decoherence.

2.1 Qubits

A quantum bit or "qubit" is the building block of a quantum computer in the same way that a conventional binary bit is a building block of a classical computer. The conventional binary bit adopts the values "0" or "1", which can be termed the "states" of the conventional binary bit. A qubit is similar to a conventional binary bit in the sense that it can adopt states, called "basis states". The basis states of a qubit are referred to as the |0> and |1> basis states. During quantum computation, the state of a qubit can be a superposition of the |0> and |1> basis states. This means that the state of the qubit simultaneously has a nonzero probability of occupying the |0> basis state and a nonzero probability of occupying the |1> basis state. The ability of a qubit to have both a nonzero probability of occupying a first basis state |0> and a nonzero probability of occupying a second basis state |1> is different from a conventional bit, which always has a value of 0 or 1.

Qualitatively, a superposition of basis states means that the qubit could be in both the |0> and |1> basis states at the same time. Mathematically, a superposition of basis states means that the overall state of the qubit, which is denoted $|\Psi>$, has the form $|\Psi>=a|0>+b|1>$, where coefficients a and b, called amplitudes, correspond to the probabilities $|a|^2$ and $|b|^2$, respectively. The coefficients a and b each have real and imaginary components, which allows the phase of qubit to be modeled. Without intending to be limited to any particular theory, it is believed that the quantum nature of a qubit is largely derived from its ability to exist in a superposition of basis states, and for the state of the qubit to have a phase. The quantum nature of a qubit is derived from its ability to exist in a coherent superposition of basis states. A qubit will retain this ability to exist as a coherent superposition of basis states when the qubit is sufficiently isolated from sources of decoherence.

Upon completion of a computation using a qubit, the state of the qubit is measured (e.g., read out). One way to perform such a measurement is to perform a projective measurement. When a projective measurement of the qubit is done, the quantum nature of the qubit is temporarily lost and the superposition of basis states reverts (collapses) to either the |0> basis state or the |1> basis state, thus regaining its similarity to a conventional bit. The actual state of the qubit after it has reverted depends on the probability amplitudes $|a|^2$ and $|b|^2$ of the state of the qubit immediately prior to the readout operation. Projective measurements are discussed further below.

2.2 General Superconducting Qubits

An important qubit class is superconducting qubits. Many superconducting qubits fall into one of two categories, phase qubits and charge qubits. Phase qubits are those that store and manipulate information in the phase states of the device. Charge qubits store and manipulate information in the charge states of the device. In superconducting materials, phase is a property of the superconducting condensate and elementary charges are represented by pairs of electrons called Cooper pairs. The division of such devices into two classes is outlined in Makhlin et al., 2001, "Quantum-State Engineering with Josephson-Junction Devices," Reviews of Modem Physics 73, pp. 357-401, which is incorporated herein by reference in its entirety.

Phase and charge are related values in superconductors and, at energy scales where quantum effects dominate, the Heisenberg uncertainty principle dictates that certainty in phase leads to uncertainty in charge and, conversely, certainty in charge leads to uncertainty in the phase of the system. Superconducting phase qubits operate in the phase regime, where each of the basis states consists of either a small number of distinct phase states or a large number of charge states. These basis states can be used in accordance with well-known principles of quantum mechanics and quantum information science to perform useful calculations.

Phase and charge qubits can be classified by the ratios of certain inherent characteristic energies of such qubits. These inherent energies, such as the charging and Josephson energies, depend on physical parameters of the respective qubits. For example, the charging energy $E_C$ of a superconducting structure, such as a Josephson junction, is defined as $e^2/(2C)$, where C is the capacitance of the superconducting structure. The Josephson energy, $E_J$, of a Josephson junction is related to the critical current of a superconducting structure. For example, the $E_J$ of a Josephson junction is proportional to the critical current $I_C$, $E_J=(\hbar/2e)I_C$, where $\hbar$ is Planck's constant divided by $2\pi$, and e is the elementary charge. For superconducting qubits the ratio of these two energies gives an indication as to whether a qubit is a charge or phase qubit. The metric, $\Gamma=4E_C/E_J$ can show whether a qubit is a phase or charge qubit. When $\Gamma$ is much greater than unity, the qubit is a charge qubit. When $\Gamma$ is much less than unity, the qubit is deemed to be a phase qubit.

Experimental realization of superconducting devices as qubits was made by Nakamura et al., 1999, Nature 398, p. 786, which is hereby incorporated by reference in its entirety. Nakamura et al. developed a charge qubit that demonstrates the basic operational requirements for a qubit but with poor (short) decoherence times and stringent requirements on control parameters.

Superconducting qubits have at least two operational coupling modes for coupling with the outside environment. When the qubit is initialized or measured, the qubit is coupled with one or more devices that can initialize or read out the qubit. Thus the first operational coupling mode of a superconducting qubit involves qubit state preparation and qubit state measurement in which the qubit is coupled to the external environment. A second operational coupling mode of a superconducting qubit involves quantum computation in which the qubit is decoupled from the environment so that decoherence due to environmental noise is minimized. Thus, a superconducting qubit computing device provides a mechanism to couple the qubit to the environment during initialization and measurement and to decouple the qubit from the environment during quantum computation. Efficient functionality of both of these modes and, in particular, the transition between them is a challenge that has not been resolved in the known art.

Two major types of decoherence effects in qubits are relaxation and dephasing. Relaxation occurs when the qubit relaxes its energy into a thermal mixture of the system's energy eigenstates. Dephasing occurs when the qubit loses its phase coherence. Dephasing usually occurs on a shorter time scale than relaxation. During quantum computation, both relaxation and dephasing need to be minimized. During readout, the readout mechanism dephases the qubit into either the |0> basis state or the |1> basis state. The readout process takes a certain amount of time, the exact amount of which is determined by a number of factors including the readout method. During readout, relaxation is an unwanted process and therefore should be prevented as much as possible by, for example, lengthening the time scale over which relaxation occurs. A qubit has an intrinsic relaxation time. Devices coupled to the qubit, such as readout mechanisms, can also contribute (shorten) the relaxation time and thus reduce the coherence time of the qubit.

One requirement for scalable quantum computing is reliable coupling, or interaction, between qubits. The coupling requirement simply means that, in order to have quantum computing, the quantum states of different qubits must be able to affect each other in a controlled manner. An example of this requirement is a conditional quantum gate where the state of one qubit is affected by the state of another qubit. Entanglement is a special type of coupling in which the quantum states of two or more qubits affect each other in such a way that the quantum states can no longer be expressed as the product of the individual qubits. The task of coupling large numbers of qubits reliably is a complex problem in the superconducting quantum computing art and has not been addressed satisfactorily.

2.3 Hybrid Qubits

Recently, superconducting hybrid charge-phase qubits that operate using both phase and charge to store, manipulate, and readout information were proposed and implemented. For an example, see Esteve et al., 2005, U.S. Pat. No. 6,838,694 B2 ("Esteve 2005"); Vion et al., 2005, U.S. Pat. No. 6,930,318 B2 ("Vion 2005"); and Vion et al., 2002, Science 296, p. 886 ("Vion 2002"), each of which is hereby incorporated by reference in its entirety. Having a structure similar to a conventional charge qubit, the hybrid qubit described by Esteve 2005, Vion 2005, and Vion 2002, has one degree of freedom in the phase basis and another degree of freedom in the charge basis. Readout involves measuring the phase of the hybrid charge-phase qubit, but computation involves interaction with either the charge or phase degrees of freedom.

Another recent superconducting hybrid qubit is found in United States Patent Application Publication No. US 2005/0082519 A1 entitled "Superconducting Phase-Charge Qubits", which is hereby incorporated by reference in its entirety, and is herein referred to as Amin et al. The qubit described therein, called a phase-charge qubit, has a structure similar to a three junction persistent current qubit. It also can operate in either the phase or charge degrees of freedom, and can be read out using either regime.

In terms of the metric $\Gamma=4E_C/E_J$, when $\Gamma$ is about unity, the qubit is a hybrid qubit. However, there is no agreement in the art about what unity means in relation to hybrid qubits. In some qubit examples, when $\Gamma$ is between ⅛ and 8, the qubits are hybrid qubits. In other qubit examples, when $\Gamma$ is between ¼ and 4, the qubits are hybrid qubits. In yet other qubit examples, when $\Gamma$ is between ½ and 2, the qubits are hybrid qubits.

2.4 Mesoscopic Systems

The term mesoscopic refers to a range of dimensions of intermediate size between microscopic and macroscopic. When used in connection to condensed matter, the term is often used in conjunction with system, as in "mesoscopic system." Mesoscopic systems are a class of systems where the individual particles in an ensemble of particles can be observed individually, whereas in macroscopic systems the particles can only be observed as a collected whole. In mesoscopic systems, quantum interference is important, since at low enough temperatures (less than about 1 kelvin) the phase coherence length of quasiparticles ("electrons") exceeds the size of the system. This means that electrons can be individually identified when passing through a mesoscopic system. The dimensions of a mesoscopic system are determined by the appearance of novel physical phenomena absent in bulk nonmesoscopic solids. As such, there is no rigid definition for the dimensions of a mesoscopic system. However, mesoscopic systems that have been studied and reported in the literature normally have dimensions in the range of 100 nanometers (nm) to 1000 nm. See, for example, *McGraw-Hill Encyclopedia of Science & Technology* 10, p. 722 ($8^{th}$ ed. 1997), which is hereby incorporated by reference in its entirety. A mesoscopic system, such as a mesoscopic island, is also defined as any system that is small enough to be governed by quantum mechanical principles rather than classical mechanical principles. For example, a mesoscopic island can be a block of superconducting material (e.g., a portion of a superconducting loop bounded by Josephson junctions) that is sufficiently small to be governed by quantum mechanical principles. Generally, in order for an island to be mesoscopic, it must have dimensions that are in the low micrometer range or smaller. An exemplary mesoscopic island has a width that is 0.2 microns or less, a length of 1.0 micron or less, and a thickness that is 0.2 microns or less. Mesoscopic systems with other dimensions are also possible.

2.5 Superconducting Phase Qubits

The superconducting phase qubit is a type of qubit that has demonstrated long coherence times, making it a candidate for scalable quantum computing. See, for example, Orlando et al., 1999, Physical Review B, 60, 15398, and Il'ichev et al., 2003, Physical Review Letters 91, 097906, which are hereby incorporated by reference in their entireties. Some other types of phase qubits comprise superconducting loops having more or less than three Josephson junctions. See, for example, Blatter et al., 2001, Physical Review B 63, 174511; and Friedman et al., 2000, Nature 406, p. 43, which are hereby incorporated by reference in their entireties. The phase qubit also has an advantage over may charge qubit designs because it is insensitive to fluctuations or noise in the charge basis. Fluctuations or noise in the charge basis is considered to be a significant source of decoherence in superconducting qubit systems.

Orlando et al., 1999, Physical Review B, 60, 15398, which is hereby incorporated by reference in its entirety, describe a phase qubit consisting of a superconducting loop, three Josephson junctions, and two capacitively coupled voltage sources. In Orlando et al., the capacitively coupled voltage sources are used to demonstrate that the parameters of the phase qubit are not affected by the gate voltage. Il'ichev et al., 2003, Physical Review Letters 91, 097906, which is hereby incorporated by reference in its entirety, use a three-Josephson junction flux qubit coupled to a high-quality tank circuit to make a continuous observation of Rabi oscillations.

2.6 Measurement Techniques for Phase Qubits

Despite the fact that the phase qubit is a promising superconducting qubit proposal, no satisfactory phase qubit readout scheme exists in the art. For example, while Orlando et al. and Il'ichev et al., discussed above, are significant accomplishments in their own right, neither reference provides satisfactory phase qubit readout mechanisms that are capable of measuring the results of quantum calculations in phase qubits without introducing a significant source of decoherence. Also, most measurement schemes for phase qubits rely on measurements that both demolish and destroy the state of the qubit upon measurement. Destruction (or dephasing) of the state of a qubit collapses the qubit's wave function into one of the qubit's basis states. Demolition (or relaxation) of the state of a qubit relaxes the qubit into a basis state or superposition of basis states that differs from the basis state the qubit adopts when the state of the qubit has been destroyed. An ideal measurement should destroy the state of the qubit without demolishing it. Therefore, a readout mechanism needs to act in an amount of time greater than the dephasing (destruction) time but less than the relaxation (demolition) time.

Korotkov et al., 2001, Physical Review B 64, 165310, which is hereby incorporated by reference in its entirety, describes a type of continuous measurement where a readout mechanism is weakly coupled to a qubit. The weak coupling ensures that the back-action (unwanted decohering disturbances) of the readout mechanism on the qubit is small. However, the effect of the qubit on the readout mechanism is also small and therefore the measurement resolution is poor. Korotkov et al. point out that there is an upper limit of four on the signal to noise ratio for the technique. Thus, the Korotkov et al. measurement scheme is not suitable even when a moderate amount of resolution is needed.

2.7 Quantum Nondemolition Measurement

Quantum nondemolition (QND) measurement is a technique for measuring the quantum state of a quantum system. QND does not demolish the quantum state of the quantum system during measurement of the quantum system. A QND measurement occurs when the quantum system being measured is coupled to a readout mechanism described by a mathematical operator that (i) is a measurable observable of the quantum system being measured and, (ii) commutes with the Hamiltonian of the quantum system. The back-action, or unwanted disturbances, of the readout mechanism does not couple back into the quantum system during QND since the mathematical operator that describes the readout mechanism commutes with the Hamiltonian that describes the quantum system being measured. Thus, relaxation effects caused by the readout mechanism are prevented. For further information, see Averin, 2002, arXiv.org:cond-mat/0202082, and Braginsky et al., 1996, Reviews of Modem Physics 68, p. 1, which are each hereby incorporated by reference in their entireties.

In contrast to a QND measurement, a projective measurement of a quantum system demolishes the quantum system's quantum state. A projective measurement is a measurement in which the state of the quantum system (e.g., qubit) is projected into the eigenstates of the readout operator. A projective measurement requires a strong system-readout coupling and fast readout response. However, a large back-action (unwanted decohering disturbance) of the measurement device on the quantum system is introduced, which limits the coherence time of the quantum system.

QND measurement was applied to the detection of weak forces acting on a gravitational-wave antenna that serves as a harmonic oscillator system. For an example, see Caves et al., 1980, Reviews of Modem Physics 52, p. 341, which is hereby incorporated by reference in its entirety. Other harmonic oscillator systems have also been measured by the QND technique. See Grangier et al., 1998, Nature 396, p. 537; and Peil et al., 1999, Physical Review Letters 83, p. 1287, both of which are hereby incorporated by reference in their entireties.

QND has also been applied to various qubit systems for quantum computing applications. For example, Travaglione et al., 2002, arXiv.org:quant-ph/0203130, which is hereby incorporated by reference in its entirety, describes a phase estimation algorithm that can act as a QND measurement on qubits. A double quantum-dot qubit measured with the QND technique was proposed in Jordan et al., 2004, arXiv.org: cond-mat/0406529, which is hereby incorporated by reference in its entirety. Pryde et al., 2004, Physical Review Letters 92, 190402, which is hereby incorporated by reference in its entirety, propose a QND measurement on a photonic qubit.

2.8 State of the Art

Given the above background, there is a need for an improved ancillary device for qubit, e.g., scalable readout mechanisms that can read the state of qubits without introducing a significant source of decoherence; and coupling mechanisms that widen the range of types of coupling for qubits.

3. BRIEF DESCRIPTION OF THE DRAWINGS

Like reference numerals refer to corresponding parts throughout the several views of the drawings.

4. SUMMARY OF THE INVENTION

Figure 1:
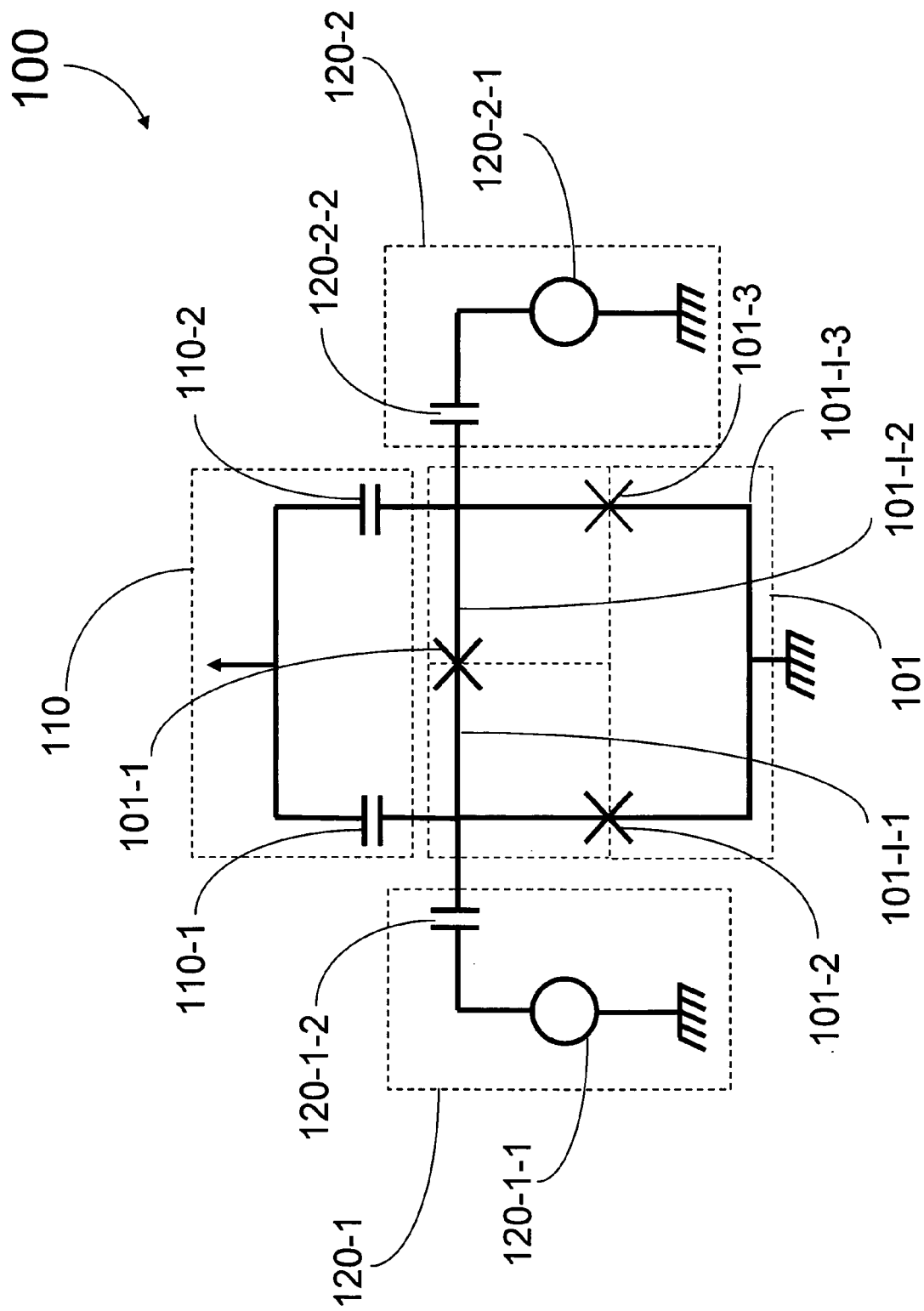
FIG. 1 illustrates a superconducting quantum computing device in accordance with an embodiment of the present invention.

There are several aspect to the present invention. A nonlimiting summary of some of these aspects is provided. A first aspect of the invention provides a method of reading out a quantum state of a qubit in a device. The device comprises a qubit having a superconducting loop and a plurality of Josephson junctions, where each Josephson junction in the plurality of Josephson junctions interrupts a different portion of the superconducting loop. Interruption of the superconducting loop by the plurality of Josephson junctions results in the delineation of a plurality of islands, including a first island and a second island. Each island in the plurality of islands is defined by a different portion of the superconducting loop and each island in the plurality of islands is bound by a different adjacent pair of Josephson junctions in the plurality of Josephson junctions. The device further comprises a first mechanism configured to tune a first gate charge of the first island. The device also comprises a second mechanism configured to tune a second gate charge of the second island. In the method the first gate charge of the first island is tuned with the first mechanism and the second gate charge of the second island is tuned with the second mechanism so that the first gate charge and the second gate charge are exactly or substantially equal. Then, the quantum state of the qubit is readout using a readout mechanism capacitively coupled to the first island and the second island.

In some embodiments in accordance with the first aspect of the invention, the qubit has an eigenstate and the reading out step comprises measuring this eigenstate. In some cases, the eigenstate is not demolished by the reading out step. In some embodiments, the reading out step does not affect the intrinsic relaxation time of the qubit. In some embodiments, the readout mechanism applies a substantially equal back-action charge to the first island and the second island during the reading out step. In some instances, the readout mechanism used in the reading out step is equally capacitively coupled to the first island and the second island. In some instances, the qubit is tuned in the tuning step by the first mechanism and the second mechanism so that a back-action charge of the readout mechanism is symmetrically canceled out on the qubit. In some embodiments, the qubit is a hybrid qubit, a phase-charge qubit, or a charge qubit. In some instances, the first island and the second island are each mesoscopic.

A second aspect of the invention provides a device comprising a qubit. The qubit, in turn, comprises a superconducting loop interrupted by a plurality of Josephson junctions. Each Josephson junction in the plurality of Josephson junctions interrupts a different portion of the superconducting loop such that each different adjacent pair of Josephson junctions in the plurality of Josephson junctions defines a different superconducting island in a plurality of superconducting islands in the superconducting loop. The device further comprises a readout mechanism having a first capacitance and a second capacitance. The first capacitance is capacitively coupled to a first island in the plurality of islands and the second capacitance is capacitively coupled to a second island in the plurality of islands. In some embodiments, the readout mechanism comprises an electrometer. In some embodiments, the first island is coupled to a first gate charge mechanism for tuning a first gate charge of the first island and the second island is coupled to a second gate charge mechanism for tuning a second gate charge of the second island. In some embodiments, the first gate charge mechanism and the second gate charge mechanism respectively tune the first gate charge and the second gate charge to an equal gate charge value. In some embodiments, the readout mechanism applies an equal back-action charge to the first island and the second island during readout of a quantum state of the qubit. In some embodiments, the readout mechanism symmetrically cancels out a back-action charge of the readout mechanism during readout of the qubit. In some embodiments, the first capacitance and the second capacitance have equal values. In some embodiments, the first capacitance and the second capacitance have capacitance values that are within a tolerance of each other. Exemplary tolerances are about ±0.1 femtofarads or about ±1 attofarad. In some instances, the tolerance causes a relaxation time of the qubit during readout by the readout mechanism to be less than or approximately equal to an intrinsic relaxation time of the qubit. In some embodiments, the qubit is a phase-charge qubit or a charge qubit.

A third aspect of the invention provides a device comprising a plurality of qubits, where each respective qubit in the plurality of qubits comprises a superconducting loop interrupted by a plurality of Josephson junctions. Each Josephson junction in the plurality of Josephson junctions interrupts a different portion of the superconducting loop and each different adjacent pair of Josephson junctions in the plurality of Josephson junctions defines a different superconducting island in a plurality of superconducting islands in the superconducting loop. The plurality of superconducting islands comprise a first subset of islands and a second subset of islands. The device further comprises a plurality of capacitances and a plurality of readout mechanisms. Each respective island in the second subset of islands in each respective qubit in the plurality of qubits is capacitively coupled to a corresponding readout mechanism in the plurality of readout mechanisms by a corresponding capacitance in the plurality of capacitances. In some embodiments in accordance with the third aspect of the invention, a first readout mechanism in the plurality of readout mechanisms comprises an electrometer, such as an rf-SET. In some embodiments, the second subset of islands in a first qubit in the plurality of qubits comprises (i) a first island that is coupled to a first gate charge mechanism for tuning a gate charge on the first island and (ii) a second island that is coupled to a second gate charge mechanism for tuning a gate charge on the second island. In some embodiments, the first gate charge mechanism and the second gate charge mechanism are configured to tune the gate charge of the first island and the second island to an equal or approximately equal value. In some embodiments, a readout mechanism in the plurality of readout mechanisms is configured to apply an equal back-action charge to a first island and a second island in the second subset of islands of a qubit in the plurality of qubits. In some embodiments, the equal back-action charge is symmetrically canceled out on the corresponding qubit. In some embodiments, the second subset of islands of a qubit in the plurality of qubits comprises a first island and a second island such that (i) the first island is capacitively coupled to a first readout mechanism in the plurality of readout mechanisms by a first capacitance in the plurality of capacitances and (ii) the second island is capacitively coupled to the first readout mechanism in the plurality of readout mechanisms by a second capacitance in the plurality of capacitances. In some such embodiments, the first capacitance and second capacitance are approximately equal. In some such embodiments, the first capacitance and the second capacitance are each independently between 1 attofarad and 1 picofarad. In some such embodiments, the first capacitance is within a tolerance of the second capacitance. Exemplary tolerances are about ±0.1 femtofarads or about ±1 attofarads. In some embodiments, the tolerance causes a relaxation time due to operation of the first readout mechanism to be less than or approximately equal to an intrinsic relaxation time of the qubit. In some embodiments, at least one qubit in the plurality of qubits is a phase-charge qubit or a charge qubit.

A fourth aspect of the present invention provides a device comprising a plurality of qubits. Each qubit in the plurality of qubits comprises a superconducting loop interrupted by a plurality of Josephson junctions. Each Josephson junction in the plurality of Josephson junctions interrupts a different portion of the superconducting loop and each different adjacent pair of Josephson junctions in the plurality of Josephson junctions defines a different superconducting island in a plurality of superconducting islands in the superconducting loop. The plurality of superconducting islands includes a first superconducting island and a second superconducting island. The device further comprises a first capacitance, a second capacitance and a plurality of readout mechanisms. In this fourth aspect of the invention, the first and second superconducting island of each respective qubit in the plurality of qubits is coupled to a corresponding readout mechanism in the plurality of readout mechanisms such that the corresponding readout mechanism applies an equal and symmetrically canceling back-action to the first island and the second island. A first qubit and a second qubit in the plurality of qubits are coupled to each other by the first capacitance and the second capacitance such that (i) the first capacitance couples the first island of the first qubit and second qubit and (ii) the second capacitance couples the second island of the first qubit and second qubit.

A fifth aspect of the invention comprises a device that, in turn, comprises a superconducting qubit. The superconducting qubit comprises a superconducting loop interrupted by a plurality of Josephson junctions. Each Josephson junction in the plurality of Josephson junctions interrupts a different portion of the superconducting loop and each different adjacent pair of Josephson junctions in the plurality of Josephson junctions defines a different superconducting island in a plurality of superconducting islands in the superconducting loop. The device further comprises a readout mechanism substantially equally coupled to a first superconducting island and a second superconducting island in the plurality of islands of the superconducting qubit such that the superconducting qubit and the readout mechanism are described by a Hamiltonian. This Hamiltonian includes a first Hamiltonian term for the back-action of the readout mechanism on the superconducting qubit. Further, the Hamiltonian and the first Hamiltonian term commute. In some embodiments in accordance with this fifth aspect of the invention, the readout mechanism is substantially equally coupled to the first superconducting island and the second superconducting island when a capacitance of the coupling between the readout mechanism and the first superconducting island is within 90%, 95%, or 99% of a capacitance of the coupling between the readout mechanism and the second superconducting island. In some embodiments, a back-action of the readout mechanism on the first superconducting island cancels the back-action of the readout mechanism on the second superconducting island.

A sixth aspect of the invention comprises a method of reading out a quantum state of a qubit in a device. The device comprises a qubit. The qubit comprises: (i) a superconducting loop, (ii) a plurality of Josephson junctions, where each Josephson junction in the plurality of Josephson junctions interrupts a different portion of the superconducting loop, and (iii) a plurality of islands, where each island in the plurality of islands is defined by a different portion of the superconducting loop and where each island in the plurality of islands is bound by a different adjacent pair of Josephson junctions in the plurality of Josephson junctions. The plurality of islands includes a first island and a second island. The device further comprises a first mechanism configured to apply a first voltage to the first island. The device also includes a second mechanism configured to apply a second voltage to the second island. Further, the device comprises a readout mechanism. The readout mechanism is capacitively coupled to the first island by a first capacitance and the readout mechanism is capacitively coupled to the second island by a second capacitance. The first and second capacitance are exactly or substantially equal. In the method, the first voltage is applied to the first island with the first mechanism and the second voltage is applied to the second island of the qubit with the second mechanism. Next, the quantum state of the qubit is readout using the readout mechanism. In some embodiments in accordance with the sixth aspect of the invention, the qubit has an eigenstate and the reading out step measures this eigenstate. In some embodiments, the eigenstate is not demolished by the reading out step. In some embodiments, the reading out step comprises inducing an equal or substantially equal back-action to the first island and the second island. In some embodiments, the applying step tunes the qubit so that a first back-action charge from the readout mechanism on the first island cancels a second back-action charge from the readout mechanism on the second island. In some embodiments, the first island and the second island are each mesoscopic. In some embodiments, the qubit is a hybrid qubit or a phase-charge qubit.

A seventh aspect of the invention comprises a device. The device comprises a plurality of qubits. Each qubit in the plurality of qubits comprises a superconducting loop interrupted by a plurality of Josephson junctions. Each Josephson junction in the plurality of Josephson junctions interrupts a different portion of the superconducting loop and each different adjacent pair of Josephson junctions in the plurality of Josephson junctions defines a different superconducting island in a plurality of superconducting islands in the superconducting loop. The plurality of superconducting islands includes a first and second superconducting island. In this seventh aspect of the invention, a first qubit and a second qubit in the plurality of qubits are coupled to each other by a first capacitance and a second capacitance. The first capacitance couples the first island of the first qubit to the first island of the second qubit. The second capacitance couples the second island of the first qubit to the second island of the second qubit. In some embodiments in accordance with the seventh aspect of the invention, the coupling between the first qubit and the second qubit is diagonal in the basis of the plurality of qubits. In some embodiments, the first capacitance is between about 0.01 femtofarads and about 2 femtofarads. In some embodiments, the first island of the first qubit is capacitively coupled to a first island of a third qubit in the plurality of qubits and the second island of the first qubit is capacitively coupled to a second island of the third qubit.

5. DETAILED DESCRIPTION

In accordance with the present invention, ancillary structures and associated methods of using the ancillary structures for superconducting qubits are described. These ancillary structures and associated methods lead to new and unexpected results. In accordance with the present invention, structures and methods for performing a quantum nondemolition measurement of a quantum state of a superconducting qubit are described. In accordance with the present invention, structures and methods for coupling two or more superconducting qubits with a diagonal Hamiltonian term are described.

Quantum Nondemolition Measurement of a Qubit

In accordance with the present invention, structures and methods for measuring a quantum state of a superconducting qubit are described. The measurement method is a type of quantum nondemolition (QND) measurement. In some embodiments of the invention, the qubit is a hybrid qubit like the phase-charge qubit described in U.S. Patent Publication No. US 2005/0082519 A1 entitled "Superconducting Phase-Charge Qubits,", which is incorporated by reference above. In other embodiments of the invention, the qubit being coupled is another type of qubit, like a superconducting phase qubit, or a superconducting charge qubit. Other embodiments of the invention disclose a multi-qubit system utilizing the QND readout described in the present invention. Other embodiments of the invention disclose a multi-qubit system.

The Hamiltonian H of a qubit system that includes a readout mechanism and a qubit contains a term $\delta H$ that describes the back-action of the readout mechanism on the qubit. When the commutation relation $[\delta H, H]$ between the qubit and the readout mechanism is nonzero, the readout can change the eigenstates of the Hamiltonian that describes the qubit, causing fast relaxation of the quantum state of the qubit. In general, $\delta H$ does not usually commute with H. In other words, the commutation relation $[\delta H, H]$ between a qubit and the readout mechanism during read out is typically nonzero. However, when the quantum state of the qubit system being measured is reduced to a special quantum state described by a two-level Hamiltonian, it is possible for $\delta H$ to commute with H. In other words, it is possible for the commutation relation $[\delta H, H]$ to approach zero or to be zero. In accordance with the present invention, $\delta H$ commutes with H during readout of the quantum state of the quantum system described by H (e.g., a hybrid qubit or a superconducting phase qubit) and an improved measurement scheme is realized. The term in brackets including the brackets themselves represents a commutation. A commutation is defined as $[A, B] \equiv AB - BA$.

Figure 2:
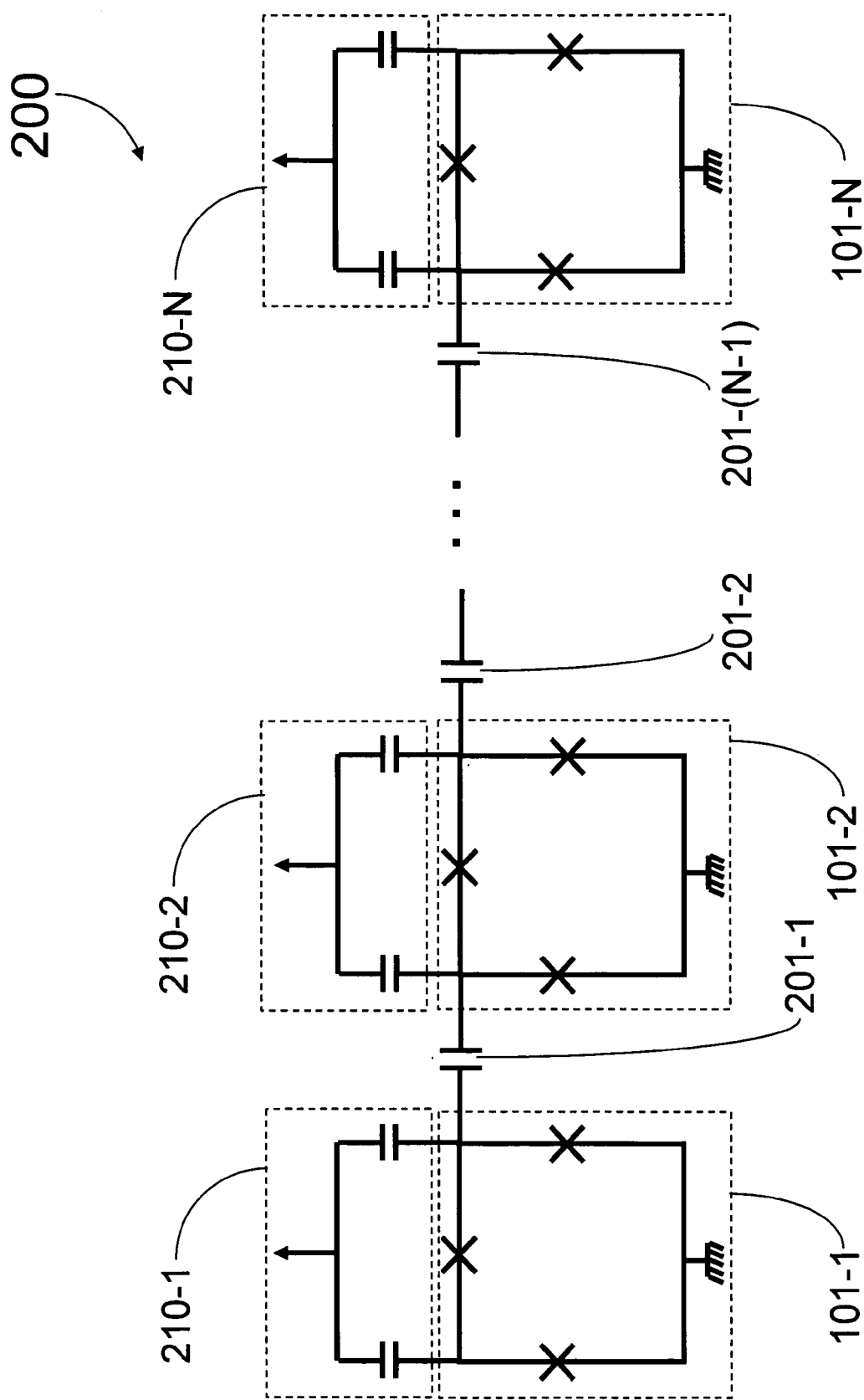
FIG. 2 illustrates a linear array of superconducting quantum computing devices in accordance with an embodiment of the present invention.

In accordance with an embodiment of the present invention, a structure for performing a quantum nondemolition measurement of a superconducting qubit comprises a superconducting qubit. The superconducting qubit includes a superconducting loop having three or more Josephson junctions. Each adjacent pair of Josephson junctions in the loop forms (defines) a mesoscopic island as illustrated in FIGS. 1 and 2. In typical embodiments there are three or more islands (e.g., 3 islands, 4 islands, 5 islands, 6 island, more than 7 islands, more than 10 islands, etc.) in a superconducting qubit. The structure further includes one or more readout mechanisms. Each readout mechanism is capacitively connected to two or more islands of the qubit. The structure further includes two or more mechanisms for controlling the gate charge of the two or more islands to which the one or more readout mechanisms are connected. In some embodiments, the qubit is a phase-charge qubit as described in United States Patent Application Publication No. US 2005/0082519 A1, herein referred to as Amin et al., which is incorporated by reference above. In some embodiments of the present invention, a readout mechanism is a charge sensitive device, such as an electrometer. Some electrometers that can be used in the present invention are single electron transistors, or SETs; see, for example, Fulton et al., 1987, Physical Review Letters 59, p. 109, which is hereby incorporated by reference in its entirety. A single electron transistor, or SET, is a device capable of measuring very small charges. It can discriminate to within a fraction of an electronic charge. Superconducting SETs, or SSETs, are SETs implemented with superconducting materials. The basic SET comprises an island defined by two Josephson junctions. An input is capacitively coupled to the island. The current through the SET is controlled by the charge applied to the SET by the input. This current can then be measured by means well known in the art. SETs are further described in U.S. Pat. No. 6,653,653, which is hereby incorporated by reference in its entirety.

An improved version of the SET, called a radio frequency SET (rf-SET) is discussed in Schoelkopf et al., 1998, Science 280, p. 1238, which is hereby incorporated by reference in its entirety. The rf-SET has potentially faster measurement times and is potentially more sensitive than normal SETs. The basic structure of an rf-SET is similar to a SET. The rf-SET comprises two Josephson junctions defining an island with an input capacitively coupled to the island. However, the rf-SET also has an LC resonant circuit, usually comprising a capacitor and inductor. A high frequency circuit is connected to the rf-SET and supplies the rf-SET with a high frequency signal. The amplitude of the signal is damped by an amount that depends on the charge of the input. The damped signal is reflected out of the rf-SET and the amount of damping is measured, providing information about the charge of the input. The charge resolution of the rf-SET can be at least an order of magnitude better than a normal SET. See also, U.S. Pat. No. 6,670,630, which is hereby incorporated by reference in its entirety.

An embodiment of the invention is illustrated in FIG. 1. Qubit 101 has three islands, 101-I-1, 101-I-2, and 101-I-3, in a superconducting loop defined by three Josephson junctions 101-1, 101-2, and 101-3. Island 101-I-1 is coupled through capacitor 120-1-2 to a mechanism 120-1 that controls the gate charge on island 101-I-1. Similarly, island 101-I-2 is coupled through capacitor 120-2-2 to a mechanism 120-2 that controls the gate charge on island 101-I-2. Island 101-I-3 is grounded. Mechanisms 120-1 and 120-2 can control the gate charge of islands 101-I-1 and 101-I-2 respectively. Mechanism 120-1 comprises a gate voltage 120-1-1 and a gate capacitance 120-1-2. Gate voltage 120-1-1 can be a power supply or a similar device. Similarly, mechanism 120-2 comprises gate voltage 120-2-1 and gate capacitance 120-2-2. In some embodiments of the present invention, gate voltages 120-1-1 and 120-2-1 can each independently have a value in the range between 1 pV (picovolt) and 1 V (volt). In some embodiments of the present invention, gate capacitances 120-1-2 and 120-2-2 can each independently have a value in the range between 1 zF (zeptofarad) and 100 pF (picofarad).

In an embodiment of the present invention two islands of a qubit are each connected to a different capacitor of a readout mechanism. For example, referring to FIG. 1, capacitors 110-1 and 110-2, which are part of readout mechanism 110, are respectively connected to islands 101-I-I and 101-I-2 thereby coupling readout mechanism 110 to these islands of qubit 101. In some embodiments, capacitors 110-1 and 110-2 have equal or substantially equal capacitance. In some embodiments, a first and second capacitor 110 have substantially equal capacitances when their capacitances are exactly equal. In some embodiments, a first and second capacitor have substantially equal capacitances when the first of the two capacitors has a capacitance that is within 90% of the capacitance of the second of the two capacitors. In some embodiments, a first and second capacitor have substantially equal capacitances when the first of the two capacitors has a capacitance that is within 95% of the second capacitance of the two capacitors. In some embodiments, a first and second capacitor have substantially equal capacitances when the first of the two capacitors has a capacitance that is within 99% of the capacitance of the second of the two capacitors. In an embodiment of the present invention, readout mechanism 110 is an rf-SET coupled to two islands of qubit 101 through capacitors 110-1 and 110-2. The capacitance of capacitors 110-1 and 110-2 is chosen so that the effect of the capacitive coupling to islands 101-I-1 and 101-I-2 does not seriously affect the operation of qubit 101. In other words, the capacitive coupling does not affect the qubit in such as way as to make it inoperable. The operations applied to the qubit can be modified in a predictable way given that the capacitive coupling is there and that it is small enough. For some values, the capacitive coupling can render the qubit inoperable. In accordance with the present invention, capacitors 110-1 and 110-2 have values ranging from about 1 attofarad (aF) to about 1 picofarad (pF).

Fabrication Methods

Fabrication of quantum computing structure 100 and other embodiments of the present invention is well known in the art. For example, many of the processes for fabricating superconducting circuits are the same as or similar to those established for semiconductor-based circuits. One aspect of fabrication of structure 100 is the composition of the circuits (e.g., the composition of superconducting loop in qubit 101). Niobium (Nb) and aluminum (Al) are superconducting materials common to superconducting circuits. There are many other superconducting materials any of which can be used to construct the superconducting aspects of structure 100. An exemplary composition is aluminum, as it is amenable to work with fabrication techniques that produce small junctions.

For smaller junctions, for example submicron junctions, techniques such as shadow evaporation can be used. Submicron junctions are junctions that have at least one spatial dimension that is less than a micron in size. Consider the fabrication of a submicron $Al$—$Al_2O_3$—$Al$ Josephson junction. In one exemplary method, a silicon wafer is cleaned and two resist layers are spun on it. The upper resist layer can be several tens of nanometers thick while the lower resist layer can be a few hundred nanometers thick. The pattern of the Josephson junction is etched on using an electron beam lithography technique. Afterwards, the resist is developed and etched off. Due to back-scattering of electrons and the greater sensitivity of the lower resist layer, a larger portion of the lower layer is removed compared to the upper layer, thereby forming an undercut. The sample is mounted in an evaporator with a sample holder that can be rotated and double-angle evaporation is performed. In double-angle evaporation, the bottom aluminum electrode is sputtered onto the wafer at an angle $\theta$ thereby allowing aluminum into the undercut. This is followed by deposition and oxidation of a thin insulating layer, and finally sputtering of the upper layer at an angle $-\theta$. The angled deposition, combined with the undercutting of the resist, allows the formation of junctions with small dimensions. The process is finished by a lift-off, removing excess resist and trilayer depositions. More information on fabrication processes for small junctions can be found in Dolan, 1977, Applied Physics Letters 31, 337; Majer, 2002, Thesis, Delft University of Technology, pp. 12-13; Paauw, 2001, Thesis, Delft University of Technology, pp. 34-36, 58-60; Born et al., 2001, IEEE Transactions on Applied Superconductivity 11, 373; Koval et al., 1999, IEEE Transactions on Applied Superconductivity 9, 3957; and Fetter et al., 1983, U.S. Pat. No. 4,370,359, each of which is hereby incorporated by reference in its entirety.

Operation Condition for Qubits

Under appropriate operating conditions, qubit 101 can store arbitrary quantum states and can perform operations useful for quantum computing. Methods for creating appropriate operating conditions are well known in the art. In some embodiments of the invention, appropriate operating conditions independently include (i) reducing the temperature of the environment surrounding the circuit to less than 1 kelvin and/or (ii) reducing environmental noise. Superconducting qubits can be operated between 5 millikelvin (niK) and 100 mK. Such temperatures can be achieved using, for example, dilution refrigerators. Providing magnetic shielding and sufficiently filtering wires that connect to the qubit can reduce environmental noise. In some embodiments, quantum computing structure 100, or other structures such as quantum computing structure 200 are operated in a dilution refrigerator. An exemplary dilution refrigerator is a model from the MNK 126 series, by Leiden Cryogenics B.V., Galgewater No. 21, 2311 VZ Leiden, The Netherlands. The use of a dilution refrigerator for performing quantum computing, or operating embodiments of the present invention can be aided by adhering to the well advanced craft of low temperature physics. See, e.g., Andrew J. Berkley, 2003, "A Josephson Junction Qubit," Ph. D. Thesis, University of Maryland, College Park, Md. 20742, USA, which is hereby incorporated by reference in its entirety.

Methods of Using the Read out Mechanism

An embodiment of the present invention for performing a QND measurement of the quantum state of a superconducting qubit comprises turning on a readout mechanism. The readout mechanism is capacitively connected to two or more islands of the qubit. A gate voltage of the two or more islands of the qubit is tuned and a charge of the qubit is detected. Referring to FIG. 1, when a measurement is to be performed, readout mechanism 110 is turned on, resulting in a back-action charge on capacitors 110-1 and 110-2. Since substantially or exactly the same back-action charge is applied to both capacitors from readout mechanism 110 and capacitors 110-1 and 110-2 have equal or near-equal capacitances, the back-action of readout mechanism 110 on qubit 101 is symmetrically canceled out. In accordance with an embodiment of the present invention, the back-action of readout mechanism 110 is equal or substantially equal for both islands (101-I-1 and 101-I-2), irrespective of the gate charge of mechanisms 120-1 and 120-2. Next, mechanisms 120-1 and 120-2 tune the gate charge of islands 101-I-1 and 101-I-2 respectively so that the gate charges of the two islands are equal or substantially equal. Tuning of the gate charges can be achieved by tuning gate voltages 120-1-1 and 120-2-1. When gate voltages 120-1-1 and 120-2-1 are tuned to within a predet charge-basis range, islands 101-I-1 and 101-I-2 respectively become sensitive to the charge basis and readout mechanism 110 then detects the quantum state of the qubit. In some embodiments, the charge-basis range for gate voltages applied to the qubit islands are between about 1 picovolt (pV) and 1 volt (V). In some embodiments of the present invention, the gate charge of islands 101-I-1 and 101-I-2 are both tuned to a value of 0.25 when qubit 101 is to be read out. In some embodiments of the present invention, the gate charge of islands 101-I-1 and 101-I-2 are both tuned to a value between 0 and 0.5 when qubit 101 is to be read out. Herein, gate charge and voltage are used interchangeably, to refer to a common value. The gate charge is related to the gate voltage by the capacitance of the gate.

The observable of the system is the voltage on both islands 101-I-1 and 101-I-2. In other words, readout mechanism 110 determines the quantum state of the qubit by observing the voltage on both of the islands. The back-action of the readout mechanism in the present invention is hereby defined as a voltage applied by the readout mechanism to qubit 101 through capacitors 110-1 and 110-2 during readout. Readout mechanism 110 is defined to be "off" when the gate voltage on islands 101-I-1 and 101-I-2 are both zero. Readout mechanism 110 is defined to be "on" when one or both gate voltages on islands 101-I-1 and 101-I-2 are nonzero.

When the gate charge on both islands 101-I-1 and 101-I-2 is equal and the back-action charge of the readout mechanism on both islands is equal, the mathematical operator that describes readout mechanism 110 commutes with the Hamiltonian of qubit 101 in the reduced two-level Hilbert space. Thus, in accordance with the present invention, the readout is a nondemolition measurement. This type of measurement prevents further relaxation effects due to readout mechanism 110 and increases readout fidelity. In some embodiments of the present invention, the back-action charge of readout mechanism 110 on both islands 101-I-1 and 101-I-2 can be close but not exactly equal (in other words, substantially equal). This could result, for example, if the capacitors connecting the readout mechanism to the qubit islands have slightly different values (e.g., within a tolerance of about 0.1 femtofarads (fF) of each other). Then, the commutation relation $[\delta H, H]$ will also be close but not equal to zero, and this will lead to a contribution to the relaxation time of the qubit. However, even such embodiments represent an improvement over known systems because the readout will produce a reduced contribution to the relaxation time relative to known systems. In other words, qubit 101 will relax at a slower rate during readout in such instances than it would during readout using known read out systems.

In FIG. 1, capacitors 110-1 and 110-2 are on either side of Josephson junction 101-1 of qubit 101. Josephson junction 101-1 has an effective capacitance determined by certain junction parameters such as size and composition. For capacitors 110-1 and 110-2 not to affect qubit operation, the series combination of the capacitors should be small or on the same order as the effective capacitance of junction 101-1. In some embodiments of the present invention, capacitors 110-1 and 110-2 each independently have a capacitance value that is between 1 aF (attofarad) and 1 pF (picofarad). In some embodiments of the present invention, capacitors 110-1 and 110-2 each independently have a capacitance value that is between 50 aF and 500 aF. In some embodiments of the present invention, capacitors 110-1 and 110-2 each have the same capacitance value plus or minus a predetermined tolerance. This tolerance can be expressed as a value or a percentage of the capacitance value of either capacitor 110-1 or 110-2. The allowed tolerance depends on the type of qubit coupled to the readout mechanism. In some embodiments, the allowed tolerance is fifteen percent or less of the capacitance of the first capacitor, meaning that the capacitance of capacitor 110-2 is within ±15% of the capacitance of capacitor 110-1. In some embodiments, the allowed tolerance is ten percent or less of the capacitance of the first capacitor, five percent or less of the capacitance of the first capacitor, or one percent or less of the capacitance of the first capacitor. When capacitors 110-1 and 110-2 are not equal, the readout mechanism contributes to the relaxation time of the qubit. In some embodiments, the magnitude of the allowable tolerance is approximately the amount that causes the relaxation time due to the readout mechanism to be the same order as the qubit's intrinsic relaxation time.

In accordance with the present invention, qubit 101 is not measured when readout mechanism 110 is off. Further, when qubit 101 is tuned to an optimum operational point, readout mechanism 110 does not affect the quantum state of qubit 101. The optimum operational point for a hybrid qubit, such as the phase-charge qubit described in Amin et al., is where the qubit state is protected from noise or perturbations in both the charge and phase basis. In the phase-charge qubit described in Amin et al., the optimum operational point allows the qubit to be insensitive to fluctuations in the charge basis. Examples of optimum operational points are described in detail in Amin et al. for the phase-charge qubit.

In some embodiments of the present invention, qubit 101 has three or more Josephson junctions, each having a Josephson energy, and the Josephson energies are approximately equal to each other. In some embodiments, one of the three or more Josephson junctions has a Josephson energy that is 0.6 to 0.9 times the Josephson energy of the other junctions. In some further embodiments, the three or more junctions have Josephson energies varying over a range of 0.6 to 1.4. In some further embodiments, the three or more Josephson junctions have Josephson energies varying over a range of 0.5 to 1. In some embodiments of the invention, the qubit islands are capacitively coupled to other devices. For example, the islands can be capacitively coupled to other qubits or to a bus. The number of devices coupled to each island is not limited to one.

In some embodiments of the present invention, the number of islands in the qubit is four and the readout mechanism couples to two of those four islands. In other embodiments of the present invention, the number of islands in the qubit is more than four and the readout mechanism is coupled to any two of the islands. In some embodiments of the invention, the number of islands in the qubit is four and the readout mechanism couples to three of those islands. For example, see the Section entitled "Coupling More Than Two Islands to the Read Mechanism," below.

FIG. 2 illustrates an embodiment of a quantum computing structure 200 in accordance with the present invention, having a plurality of qubits 101. Qubits 101 are arranged in a linear array and capacitors 201-1 through 201-(N–1) permit the qubits to be coupled by nearest neighbor coupling. Each qubit has a superconducting loop that is interrupt by Josephson junctions thereby forming three or more islands in the superconducting loop. At least one qubit 101 in linear array 200 is capacitively coupled to a readout mechanism 210 by two of its islands, such that a QND measurement can be performed. In some embodiments of the invention, each of the two capacitors in readout mechanism 210 has the same value. Mechanisms for tuning the gate charge of the qubit islands are not shown in FIG. 2, but nevertheless are present. Such mechanisms are similar or identical to those illustrated, for example, in FIG. 1.

In accordance with an embodiment of the present invention, a method for performing a QND measurement on one or more qubits in an array of qubits includes turning on a readout mechanism 210. Readout mechanism 210 applies a back-action charge equally to two islands of a corresponding qubit 101. The gate charge of the qubit islands that are coupled to the readout mechanism 210 are tuned so that the gate charge on the two islands is exactly or substantially equal. In some embodiments of the present invention, gate voltages 120-1-1 and 120-2-1 can be tuned to a value between 1 pV (picovolt) and 1 V (volt). The state of the qubit 101 in the array is then detected. In some embodiments of the present invention, the measurement of each qubit state in the qubits in the array happens simultaneously, nearly simultaneously, or sequentially. In such embodiments, the readout mechanisms 210 respectively corresponding to each of the qubits 101 in the array of qubits operate in the aforementioned manner in a synchronized manner. However, each respective qubit 101 in structure 200 can have a different amount of back-action charge applied to the respective qubit. The linear array of qubits in structure 200 can be homogenous or heterogeneous. A homogenous array is an array where all the qubits are of the same type. A heterogeneous array is an array where the qubits can be of different types. Additionally, readout mechanisms 210 for each qubit need not be identical to each other. In FIG. 2, qubits 101-1, 101-2, and 101-N are coupled to corresponding readout mechanisms 210 such that a QND measurement can be performed. In some embodiments of the present invention, one or more qubits in a plurality of qubits are coupled to a readout mechanism that is configured to perform projective measurements, and one or more qubits in the plurality of qubits is configured to perform QND measurements.

Coupling More Than Two Islands to a Readout Mechanism

Figure 5:
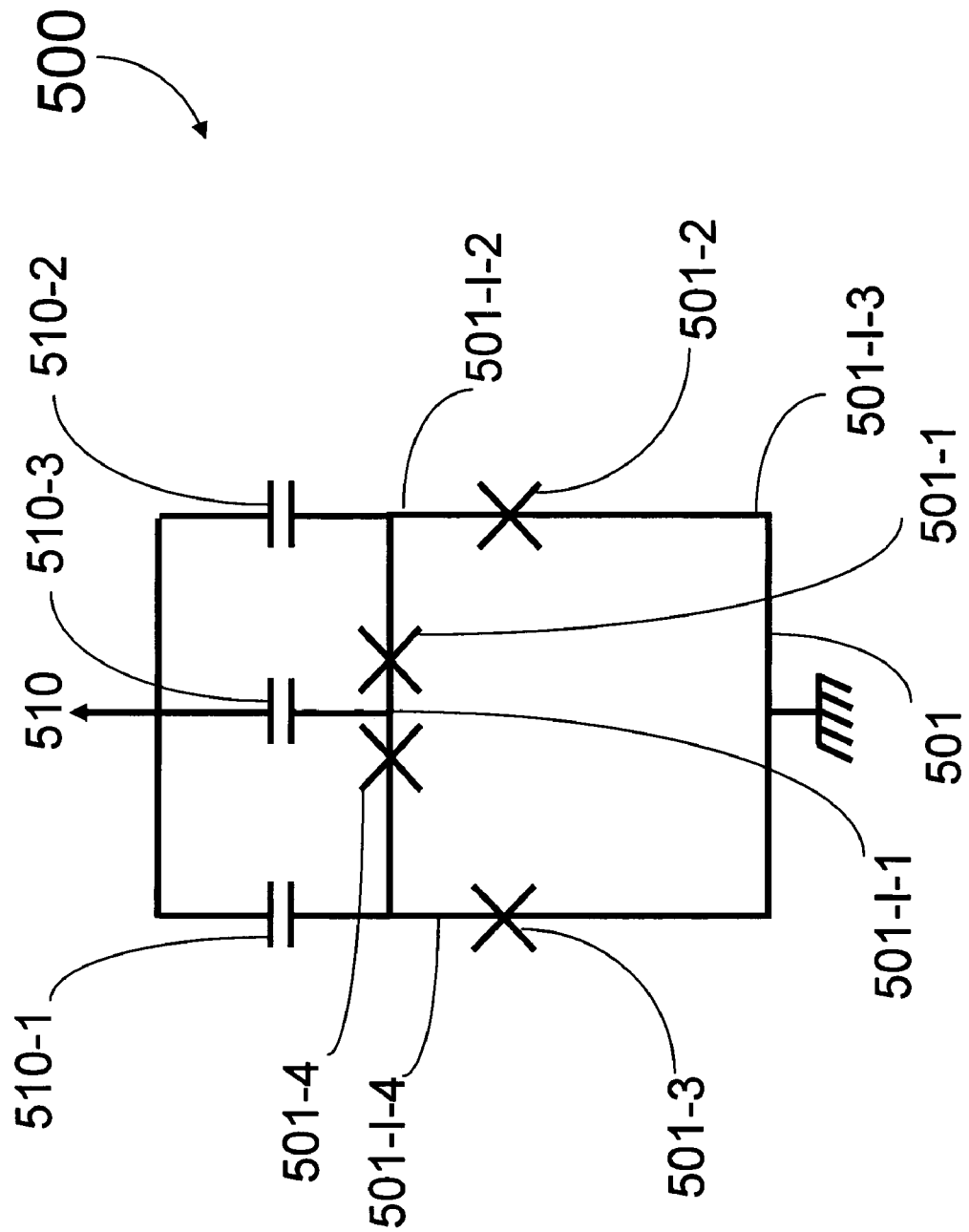
FIG. 5 illustrates another superconducting quantum computing device in accordance with another embodiment of the present invention.

An embodiment of the invention is illustrated in FIG. 5. Qubit 501 has four islands, 501-I-1, 501-I-2, 501-I-3, and 501-I-4, in a superconducting loop defined by Josephson junctions 501-1, 501-2, 501-3, and 501-4. All, all but one, some, or one of these islands may be coupled through a capacitor to a mechanism that controls the gate charge on each respective island. Such an arrangement is shown for islands 101-I-1 and 101-I-2 in FIG. 1. In many embodiments, one island, for example, island 501-I-3, is grounded.

In an embodiment of the present invention, three capacitances respectively connect three islands of qubit 501 to readout mechanism. Capacitors 510-1, 510-2, and 510-3 respectively connect islands 501-I-4, 501-I-2 and 501-I-1 to readout mechanism 510. Capacitors 510-1 and 510-2 have substantially equal capacitances. In accordance with the present invention, capacitors 510-1 and 510-2 each independently have capacitance values in the range between about 1 attofarad (aF) and about 1 picofarad (pF). In some embodiments, capacitors 510-1 and 510-2 have substantially equal capacitance values when the first of the two capacitors has a capacitance that is: exactly the same, within 99%, within 95%, or within 90% of the second of the two capacitors. In some embodiments, the third capacitor, 510-3, has a capacitance value that is less than the other two capacitors. In an embodiment, capacitor 510-3 has a capacitance less than capacitors 510-1 and 510-2 when capacitor 510-3 has a capacitance that is: less than 50%, less than 10%, less than 2%, less than 1%, less than 0.05% of the capacitance of either capacitor 510-1 or 510-2.

In some instances, a device in which three capacitances respectively connect three islands of a four island qubit to a readout mechanism (device 500) is easier to fabricate than device 100. Capacitors 510-1, 510-2, and 510-3 can have a common terminal (capacitor plate) on the readout mechanism side of the capacitors and the individual terminals can be a portion of the respective islands, e.g., 501-I-1, 501-I-2, and 501-I-4 as illustrated in FIG. 5. The ability to create common terminal and the use of the islands as terminals simplifies the fabrication of qubit structure 500. These techniques can be applied to other structures described herein. In some embodiments, one of the Josephson junctions 501-1 and 501-4 can be much larger than the other Josephson junctions. In such cases, the large Josephson junction appears as a short relative to the smaller junctions. For example, Josephson junction 501-1 can be twice, five, or ten times larger than Josephson junction 501-4.

An embodiment of the present invention for performing a QND measurement of the quantum state of a superconducting qubit, such as 501, comprises turning on a readout mechanism 510. Readout mechanism 510 is capacitively connected to three islands of qubit 501. A gate voltage of two islands of qubit 501, 501-I-4 and 501-I-2 is tuned and a charge of qubit 501 is detected. In some embodiments, a gate voltage is applied to common electrode 510, resulting in a gate charge on each of islands 501-I-1, 501-I-2, and 501-I-4. Performing QND measurements on qubit 501 is analogous to such measurements on qubit 101, the procedure for which is described above. The concept of readout for a phase-charge qubit is described in Amin et al. At the time of readout, a gate voltage is applied to the islands whose charge is to be readout to generate a state dependent voltage on the islands. It is equally valid to say a state dependent charge is created on the islands. In an embodiment of the invention, the voltage is applied adiabatically. The state dependent voltage (charge) is then detected by the readout mechanism.

Diagonal Coupling of Qubits

In accordance with the present invention, structures and methods for coupling two or more qubits such that the coupling is diagonal are described. Diagonal coupling is a coupling between qubits, were the Hamiltonian term describing the coupling is diagonal in the qubit's physical basis. Diagonal coupling is also known as ZZ coupling, or even $\sigma_Z \oplus \sigma_Z$ coupling, because the qubit physical basis is often associated with eigenvectors of the $\sigma_Z$ Pauli matrix. A $\sigma_Z$ Pauli matrix is a two by two matrix with zeros off diagonal, with one and minus one on the diagonal. In some embodiments of the present invention, the qubit is a hybrid qubit like the phase-charge qubit described in Amin et al., U.S. Patent Publication No. US 2005/0082519 A1, entitled "Superconducting Phase-Charge Qubits," which is hereby incorporated by reference. In other embodiments of the present invention, the qubit being coupled is another type of qubit, like a superconducting phase qubit, or a superconducting charge qubit. Embodiments of the invention may utilizing the QND readout described in the present invention for qubit systems coupled to readout mechanisms in accordance with the present invention.

The Hamiltonian H of a multi-qubit system that includes two interacting qubits contains a term, $H_{INT}$, that describes the interaction between the two qubits. When the interaction term, $H_{INT}$, commutes with the terms for each qubit, then the interaction term is diagonal. Mathematically, if the first commutation relation $[H_{INT}, H_A \oplus \sigma_0]$, where $H_A$ is the Hamiltonian term of the first qubit is zero, and if the second commutation relation $[H_{INT}, \sigma_0 \oplus H_B]$, where $H_B$ is the Hamiltonian term of the second qubit is zero, then the coupling between the first and second qubit is diagonal. If the two commutation relations are near zero the coupling is near diagonal. Here $\sigma_0$ is the zero$^{th}$ Pauli matrix: two by two matrix with ones on the diagonal, and zeros off-diagonal. In general, for qubits like the phase-charge qubit in the hybrid regime or charge regime, the coupling term for the interaction between two qubits coupled in accordance with the prior art is not diagonal. In accordance with the present invention, the coupling term is made diagonal by having two couplers between each qubit, each providing an equal and symmetrically canceling back-action thereby realizing a diagonal coupling. Herein, the phrase "coupling term" and "interaction term" are used interchangeably.

In an embodiment of the present invention, two qubits are coupled by two capacitances disposed between them, where each of the two capacitances independently couples one island from each of two neighboring qubits. In an embodiment of the present invention, two qubits are coupled by two capacitances such that the coupling is diagonal in the basis of the qubit. The islands with coupled capacitances also have associated mechanisms for applying a gate voltage, e.g., 120-1 of FIG. 1. When the gate voltages of the islands are set to zero, the charge on the islands of each qubit will be independent of their states and therefore no coupling is expected. When both voltages of the four islands (two on each qubit) become finite, state-dependent charges appear on the islands and the qubits couple.

In an embodiment of the present invention, the computation states, the states that are used for computation, are not the physical basis states of the qubits but are the symmetric and anti-symmetric combinations of the qubit's basis states. For the qubit of Amin et al., physical basis states are the clockwise and counterclockwise circulating persistent current. These states can be denoted |CW> and |CCW>. If the qubits of Amin et al. are flux biased with about a half flux quantum (i.e., f≈0, see Example 1, below) the physical states are difficult to distinguish. The operational states of the qubits can be the symmetric, |–>=|CW>–|CCW>, and anti-symmetric, |+>=|CW>+|CCW>, combinations of the qubit's basis states.

Figure 6A:
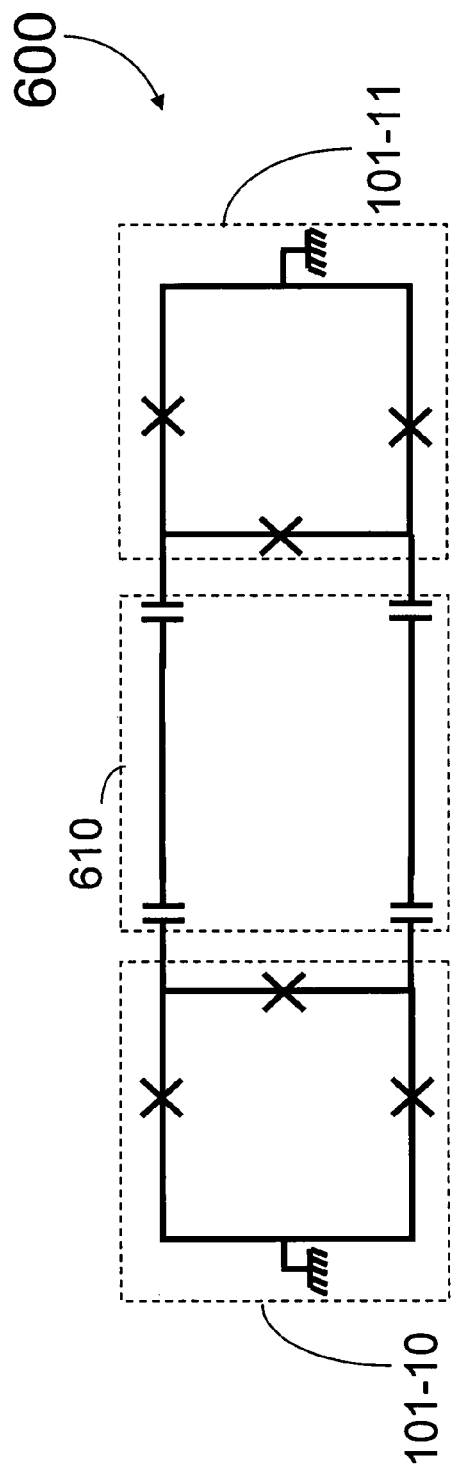
FIG. 6 illustrates structures for coupling superconducting quantum computing devices in accordance with another embodiment of the present invention.

FIG. 6A shows a quantum computing device 600, comprising two superconducting qubits 101-10, and 101-11. In an embodiment of the present invention, these superconducting qubits are hybrid qubits as disclosed in Amin et al. In an embodiment of the present invention, these superconducting qubits have structure similar to qubits of Amin et al. but are in the charge regime. Between qubits 101-10 and 101-11 are a plurality of capacitances 610. In the plurality of capacitances 610, capacitors pairwise couple two islands, one from each qubit. The network can have one or more capacitances, where each capacitance pairwise couples two islands, one from each qubit. Referring to FIG. 6A, in an embodiment of the present invention qubit 101-10 is coupled to qubit 101-11. This coupling allows the state of qubit 101-10 and the state of qubit 101-11 to influence each other. In such an embodiment, the coupling between qubits 101-10 and 101-10 is diagonal in the basis of the qubits.

Figure 6C:
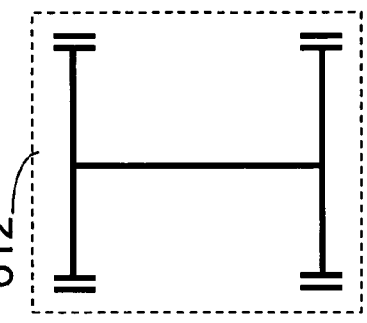

The way the plurality of capacitances couples the qubits is application specific. In an embodiment of the present invention, four capacitances are placed between four islands on two superconducting qubits such that the islands are coupled in pairwise manner. See, for example, FIG. 6A, were capacitances 610 couples qubits 101-10 and 101-11. In an embodiment of the present invention, two capacitances are placed between four islands on two superconducting qubits such that the islands are coupled in a pairwise manner. This is shown as a plurality of capacitances 611 in FIG. 6B. In an embodiment of the present invention an island, or a plurality of islands, are placed between two superconducting qubits such that two islands in the first of the two superconducting qubits are coupled to two island in the second of the two superconducting qubits. This is shown as a plurality of capacitances 612 of FIG. 6C. Plurality of capacitances 610 and plurality of capacitances 611 allow for the gate voltages on the four connected islands to be tuned with greater independence than plurality of capacitances 612.

In an embodiment of the present invention, the capacitance used to couple one island of one qubit to another island of another qubit is about 1 femtofarad. In an embodiment of the present invention, the capacitance used to couple one island of qubit to another island of another qubit is about 0.1 femtofarad. In an embodiment of the present invention, the capacitance used to couple one island of one qubit to another island of another qubit is about 2 femtofarads. In an embodiment of the present invention, the capacitance used to couple one island of one qubit to another island of another qubit has a value in the range of 0.01 femtofarad to 2 femtofarads.

Figure 6B:
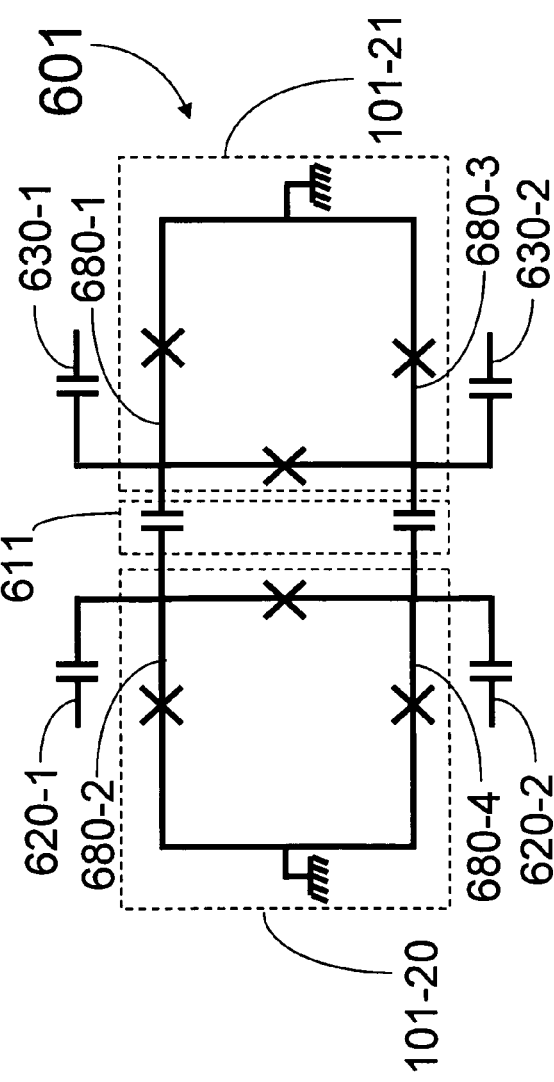

FIG. 6B illustrates an embodiment of a quantum computing structure 601 in accordance with the present invention having a plurality of qubits 101. Qubits 101-20 and 1010-21 are connected to each other by capacitance 611 in the manner shown. Further, qubits 101-20 and 101-21 are arranged in a array (e.g., a linear array) in which capacitances 620 and 630 permit the qubits to be coupled with other qubits in the array. In one example, capacitances 630-1 and 630-2 each couple an island 680 of the qubit in the array to the right of qubit 101-21 (not shown).

Although not shown in FIG. 6B, in some embodiments, each of the islands 680 to which capacitances 620 and 630 are coupled are also coupled with other capacitances. For instance, in some embodiments, islands 680-2 and 680-4 are each respectively capacitively coupled with a different capacitor of a first readout mechanism (not shown), having the same specifications as readout mechanism 110 described in conjunction with FIG. 1, thereby coupling the first readout mechanism to islands 680-2 and 680-4. In such embodiments, the capacitor that couples the first readout mechanism to island 680-2 has equal or substantially equal capacitance as the capacitor that couples the first readout mechanism with island 680-4. Likewise, in some embodiments, islands 680-1 and 680-3 are each respectively capacitively coupled with a different capacitor of a second readout mechanism (not shown), having the same specifications as the readout mechanism 110 described in conjunction with FIG. 1, thereby coupling the second readout mechanism with islands 680-1 and 680-3. In such embodiments, the capacitor that couples the second readout mechanism with island 680-1 has equal or substantially equal capacitance as the capacitor that couples the second readout mechanism with island 680-3. Moreover, in some embodiments, each island 680 is independently capacitively coupled with a different gate charge mechanism, where each such gate charge mechanism has the same specifications as mechanism 120 of FIG. 1, in order to individually control the gate charge on each such islands. Thus, in some embodiments, each island 680 can be capacitively coupled with three or more different devices (e.g., another qubit, a gate charge mechanism and a readout mechanism). In this way, islands 680 can be placed in a state dependent state for both qubit-qubit couplings and for qubit readout. Corresponding islands in the devices illustrated by FIGS. 6A and 6C can likewise be capacitively coupled with multiple devices to effect the same purpose.

EXAMPLE 1

Mathematical Example of Quantum Nondemolition Charge Measurement of a Flux Qubit In a qubit system, a readout operator does not necessarily commute with the qubit's Hamiltonian, making the readout process destructive for the qubit's eigenstates. Nevertheless, it can be possible to design the system and readout biasing point in such a way that the two commute in the reduced two level Hilbert space. An example of such a case is presented. In this example, the energy eigenstates of a flux qubit can be read out, in a nondemolition way, using the charge degree of freedom.

Readout of the final states of the qubits is an important part of any quantum computation scheme. Most commonly, the readout is assumed to be projective, meaning that the state of the qubit is projected into the eigenstates of the readout operator. This, however, requires strong qubit-detector coupling and fast readout response, which in practice can limit the coherence time of the system because of large back-action of the readout on the qubit. For a projective measurement, the dephasing time $\tau_\phi$ due to the readout back-action should be much smaller than the free evolution time of the qubit; $\tau_{\phi<<\Delta^{-1}}$, where $\Delta$ is the qubit's energy splitting. It is also possible to measure the qubit's state with much weaker coupling ($\tau_\phi<<\Delta^{-1}$) as long as $\tau_\phi \leq \tau_{meas} \leq \tau_{mix}$. See, Makhlin et al., 2001, Reviews of Modern Physics 73, p. 357, which is hereby incorporated by reference in its entirety. Here, the measurement time $\tau_{meas}$ determines when the two states have distinguishable output, and the mixing time $\tau_{mix}$ shows when the information about the initial states is destroyed due to the interaction with the detector. In this regime, called the Hamiltonian dominated regime in Makhlin et al., 2001, Reviews of Modern Physics 73, p. 357, previously incorporated by reference, the qubit is measured in the eigenstates of its own Hamiltonian and the detector's output is the expectation value of the readout operator in the these eigenstates. The back-action noise will cause extra relaxation of the qubit to its ground state, which determines $\tau_{meas}$. If the coupling is weak enough, it is also possible to continuously monitor the quantum evolution of the qubit. See, Korotkov and Averin, 2001, Physical Review B 64, 165310; Smirnov, 2003, Physical Review B 68, 134514; and Il'ichev et al., 2003, Physical Review Letters 91, 097906, each of which is hereby incorporated by reference in its entirety.

In a Quantum Nondemolition (QND) measurement, the readout can measure the eigenstates of the qubit Hamiltonian without destroying them (e.g., causing fast relaxation). Mathematically, it means that the readout operator commutes with the qubit Hamiltonian. Hence, $\tau_{mix}$ will be determined by the intrinsic relaxation time of the qubit, which could be long. While increasing the readout fidelity, it allows the reduction in the qubit-readout coupling to effect a decrease in unwanted decoherence effects due to the readout back-action.

In the charge-phase qubit the readout operator (flux) commutes with the qubit Hamiltonian only at the flux degeneracy point. See, Esteve et al., 2002, U.S. Pat. No. 6,838,694 B2; and Vion et al., 2002, Science 296, p. 886, each of which is hereby incorporated by reference in its entirety. At the time of readout, however, the qubits are moved away from the flux degeneracy point, making the readout a type other than the QND type. This can explain the observed small readout fidelity in the experiment described in Vion et al., 2002. Embodiments of the present invention include examples of QND measurement schemes to read out a flux qubit using the charge degree of freedom. A hybrid charge-flux structure working in the flux regime was proposed in U.S. Patent Publication No. US 2005/0082519 A1 entitled "Superconducting Phase-Charge Qubits,", which is hereby incorporated by reference in its entirety. In embodiments of the present invention, QND readout of such a qubit using a sensitive charge detector is proposed.

A nonlimiting example of a qubit in accordance with FIG. 1 consists of a superconducting loop, containing three Josephson junctions, threaded by an external flux $\Phi_x$ close to half a flux quantum. That is $\Phi_x \approx \Phi_o/2$, and $\Phi_o = h/2e$, or $2.068 \times 10^{-15}$ weber. See, Mooij et al., 1999, Science 285, p. 1036; Orlando et al., 1999, Physical Review B 60, p. 15398; and U.S. Patent Publication No. US 2005/0082519 A1 entitled "Superconducting Phase-Charge Qubits,", each of which is hereby incorporated by reference in its entirety. In an embodiment of the present invention, the Josephson energy $E_J$ and junction capacitance C of two of the junctions 101-2 and 101-3 are the same while that of the third junction 101-1 is slightly smaller (this configuration is chosen to simplify the mathematics in this example, e.g., $\alpha E_J$ and $\sim \alpha C_J$, with $0.5 < \alpha < 1$). In addition, two voltage sources (120-1 and 120-2), mechanisms that control the charge on respective islands (101-I-1 and 101-I-2), with respective voltages $V_{gA}$ and $V_{gB}$, are capacitively connected to islands 101-I-1 and 101-I-2 of FIG. 1. These voltage sources are respectively denoted A and B in this example. Islands 101-I-1 and 101-I-2 are each capacitively coupled to an RF-SET, which serves as a sensitive charge detector for quantum state readout. See, Schoelkopf et al., 1998, Science 280, p. 1238; and Devoret and Schoelkopf, 2000, Nature 406, p. 1039, both of which are hereby incorporated by reference in their entireties. Such a readout scheme has proven successful in reading out the state of charge qubits. See Guillaume et al., 2004, Physical Review B 69, 132504; and Duty et al., 2004, Physical Review B 69, 140503, each of which is hereby incorporated by reference in their entireties.

Define $\phi=(\phi_1+\phi_2)/2$ and $\theta=(\phi_1-\phi_2)/2$, where $\phi_{1,2}$ are the phase differences across the two larger junctions. The Hamiltonian of the system is the written as ($\hbar=1$)

$$H = \frac{(P_\phi + n_+)^2}{2M_\phi} + \frac{(P_\theta + n_-)^2}{2M_\theta} + U(\phi, \theta),$$

where $$U(\phi, \theta) = E_J[-2\cos\phi\cos\theta + \alpha\cos(2\pi f + 2\theta)]$$

$$M_\phi = 2\left(\frac{\Phi_0}{2\pi}\right)^2 C(1+\gamma)$$

$$M_\phi = 2\left(\frac{\Phi_0}{2\pi}\right)^2 C(1+\gamma+2\alpha)$$

Here $P_{100} = -i\partial/\partial_{100}$ and $P_\theta = -i\partial/\partial_\theta$ are the momenta conjugate to $\phi$ and $\theta$, $\gamma = C_g/C$, $C_g$ is the capacitance of a gate, such as 120-2-1 of FIG. 1, C is the capacitance of a junction in the qubit, and $n_\pm = n_A \pm n_B$, where $n_{A,B} = V_{gA,gB}C_g/2e + \delta n_{A,B}$ are the normalized gate charges that also include the back-action effect of the readout (e.g. $\pm n_{A,B}$). At $f \equiv \Phi_x/\Phi_o - \frac{1}{2} = 0$, $U(\phi, \theta)$ has degenerate minima at $\phi=0$, $\theta=\pm\arccos(\frac{1}{2}\alpha)$.

To study the effect of back-action of the readout on the qubit, one can extract from the Hamiltonian terms that include $\delta n_{A,B}$. In this example a small $\delta n_{A,B}$ is assumed, $$\delta H = \frac{P_\phi}{M_\phi}(\delta n_A + \delta n_B) + \frac{P_\theta}{M_\theta}(\delta n_A - \delta n_B) \quad (1)$$

The commutation relation $$[\delta H, H] = -i(\sin\phi\cos\theta)\frac{\delta n_A + \delta n_B}{M_\phi} - i(\cos\phi\sin\theta - 2\alpha\sin 2\theta)\frac{\delta n_A - \delta n_B}{M_\theta}$$

is clearly nonzero, meaning that the readout can change the eigenstates of the Hamiltonian causing fast relaxation of the qubit. For a qubit well in the flux regime, the qubit wave-function is confined within one unit cell in phase space. The fluctuations of $\phi$ is small and therefore for the lowest energy eigenstates $\phi \approx 0$. Thus $[\delta H, H] \propto \delta n_A - \delta n_B$ vanishes if $\delta n_A = \delta n_B$ (e.g. when $C_{gA} = C_{gB}$). Inter-unit-cell tunneling, however, can delocalize $\phi$, conflicting with the above argument. In general, it may not be possible to have $\delta H$ commute with H. However, in a Hilbert state reduced to the first two energy levels, it is possible to achieve such a regime. Therefore a much weaker requirement, e.g., $<1|\delta H|0>=0$ is enough to achieve QND measurement.

First consider the first term of (1). The following definition can be used, $$P_\phi^{10} \equiv \langle 1 | P_\phi | 0 \rangle = \frac{1}{2}\int d\phi \int d\theta \Psi_1(\phi, \theta)(-i\partial_\phi)\Psi_0(\phi, \theta). \quad (2)$$

When $n_A = n_B = 0$, then $$\Psi_{0,1}(-\phi, \theta) = \Psi_{0,1}(\phi, \theta) \quad (3)$$

$$\Psi_{0,1}(\phi, -\theta) = \pm\Psi_{0,1}(\phi, \theta) \quad (4)$$

Either of equations (3) or (4) is enough to make (2) vanish. To see explicitly how these symmetries change with finite $n_A$ and $n_B$, one first solves a simple quantum mechanical problem. Consider a one dimensional particle in a symmetric periodic potential V(x)

$$H = \frac{1}{2m}(P + eA/c)^2 + V(x), \quad (5)$$

$$V(x+d) = V(x) = V(-x), \quad (6)$$

where A is a uniform vector potential. The eigenfunctions of this system are described by Bloch wave functions. The ground state of the system has zero crystal momentum and is therefore the solution of equation (5) with periodic boundary condition $$\Psi_0(x+d) = \Psi_0(x) \quad (7)$$

When A=0, the ground state is symmetric with respect to variable x, i.e., $\Psi_0(-x)=\Psi_0(x)$. At finite A, one can perform a gauge transformation to remove A from equation (5). The boundary condition then becomes $$\Psi_0(x+d) = e^{i\chi}\Psi_0(x), \quad (8)$$

where $\chi = \int (e/\hbar c)Adx = eAd/\hbar c$. To find out how $\chi$ will affect the symmetry of the wave function, one can use an approximation such as the Wentzel-Kramers-Brillouin-Jeffeys (WKBJ) approximation assuming V(d/2)>>$E_0$, with $E_0$ being the ground state energy.

If x=±a is taken to be the classical turning points: V(a)=$E_0$. The ground state wave function, in the region −a<x<a, can be written as the sum of symmetric and asymmetric components $$\Psi_0(x) = \Psi_s(x) + \Psi_a(x) \quad (9)$$

For a<x<d−a, the wave function is exponentially decaying $$\Psi_0(x) = Ce^{-\lambda(x)} + Ce^{-\lambda(d-x)} \quad (10)$$

where $\lambda(x) = \int_a^x dx\sqrt{2m[V(x)-E_0]}/h$. At x=a (classical turning point) the boundary condition reads $$\Psi_0(x) = C + \epsilon C' + C + O(\epsilon) \quad (11)$$

where $\epsilon = e^{-\lambda(d-a)} << 1$. Similarly, from the boundary condition x=d−a, then $C' = \Psi_0(d-a) + O(\epsilon) = e^{i\chi}C + O(\epsilon)$, thus $$\Psi_0(a) = \Psi_s(a) + \Psi_a(a) = C + \epsilon e^{i\chi}C + O(\epsilon^2). \quad (12)$$

Likewise, from the x=−a boundary condition, then $$\Psi_0(-a) = \Psi_s(a) - \Psi_a(a) = C + \epsilon e^{-i\chi}C + O(\epsilon^2) \quad (13)$$

Combining the two equations, $$\Psi_a(a) = i\epsilon C \sin \chi + O(\epsilon^2). \quad (14)$$

Therefore, the presence of the vector potential requires addition of an asymmetric term to the symmetric ground state, proportional to $\sin \chi$. Such a statement can be extended to other energy levels as well. The wave function of the system in the $i^{th}$ state, therefore, has the form $$\Psi_i = \Psi_i^0(x) + \sin \chi \Psi_i^1(x) \quad (15)$$

where $\Psi_i^1(x)$ is a small term with the opposite symmetry as $\Psi_i^0(x)$. In the small $\epsilon$ regime, $\Psi_i^1(x)$ is mainly determined by the geometry of the well and therefore independent of $\chi$. For example, when the two lowest levels of the system is well separated from the rest, $\Psi_0^1(x) \propto \Psi_1^0(x)$.

Now returning to the qubit system. The two dimensional potential energy of the system is $2\pi$ periodic in both $\phi_1$ and $\phi_2$ directions. In terms of $\phi$ and $\theta$, the periodic boundary condition is written as $$\Psi(\phi+\pi,\theta\pm\pi) = e^{i\pi(n_+\pm n_-)}\Psi(\phi,\theta) \quad (16)$$

A straightforward generalization of the above argument gives $$\Psi_i(\phi, \theta) =$$
$$\Psi_i^0(\phi, \theta) + \sin\pi n_+ \Psi_i^1(\phi, \theta) + \sin\pi n_- \Psi_i^2(\phi, \theta) + \sin\pi n_+ \sin\pi n_- \Psi_i^3(\phi, \theta)$$

For the ground (excited) state, $\Psi_i^0$ and $\Psi_i^2$ are symmetric (symmetric) functions of $\phi$, while $\Psi_i^1$ and $\Psi_i^3$ are antisymmetric (antisymmetric). Likewise, $\Psi_i^0$ and $\Psi_i^1$ are symmetric (antisymmetric) in $\theta$, while $\Psi_i^2$ and $\Psi_i^3$ are antisymmetric (symmetric). Neglecting the small $O(\epsilon)$ contribution from the decay region, equation (2) gives $$P_\phi^{10} = Z\sin\pi n_+ \sin\pi n_- \quad (17)$$
$$= \frac{1}{2}Z(\cos 2\pi n_A - \cos 2\pi n_B)$$

where $$Z = A_{03}^{10} + A_{12}^{10} + A_{21}^{10} + A_{30}^{10},$$

and $$A_{\alpha\beta}^{ij} = \frac{1}{2}\int d\phi \int d\theta \Psi_i^\alpha(\phi, \theta)(-i\partial_\phi)\Psi_j^\beta(\phi, \theta),$$

Similarly, for $P_\theta$ then, $$P_\theta^{10} = B_{00}^{10} + B_{11}^{10}\sin^2\pi n_+ + B_{22}^{10}\sin^2\pi n_- + B_{33}^{10}\sin^2\pi n_+\sin^2\pi n_- \quad (18)$$

where $$B_{\alpha\beta}^{ij} = \frac{1}{2}\int d\phi \int d\theta \Psi_i^\alpha(\phi, \theta)(-i\partial_\theta)\Psi_j^\beta(\phi, \theta),$$

While $P_\theta^{10}$ is always finite, $P_\phi^{10}$ vanishes when either $n_+$ or $n_-$ is an integer number. Therefore, if one requires $\delta n_A = \delta n_B$ in (1), then $<1|\delta H|0> = 0$ at those symmetry points. This is possible by symmetrically coupling the two islands to the readout circuit ($C_{gA} = C_{gB}$).

The above argument is valid beyond the approximations used to derive equations (17) and (18). Indeed, the symmetries in equations (3) and (4) always hold when respectively $n_+$ and $n_-$ are integer numbers, causing the value of equation (2) to vanish. A simple way to obtain these symmetry points is to make $n_A = \pm n_B$, which correspond to $n_\mp = 0$, respectively.

Figure 3:
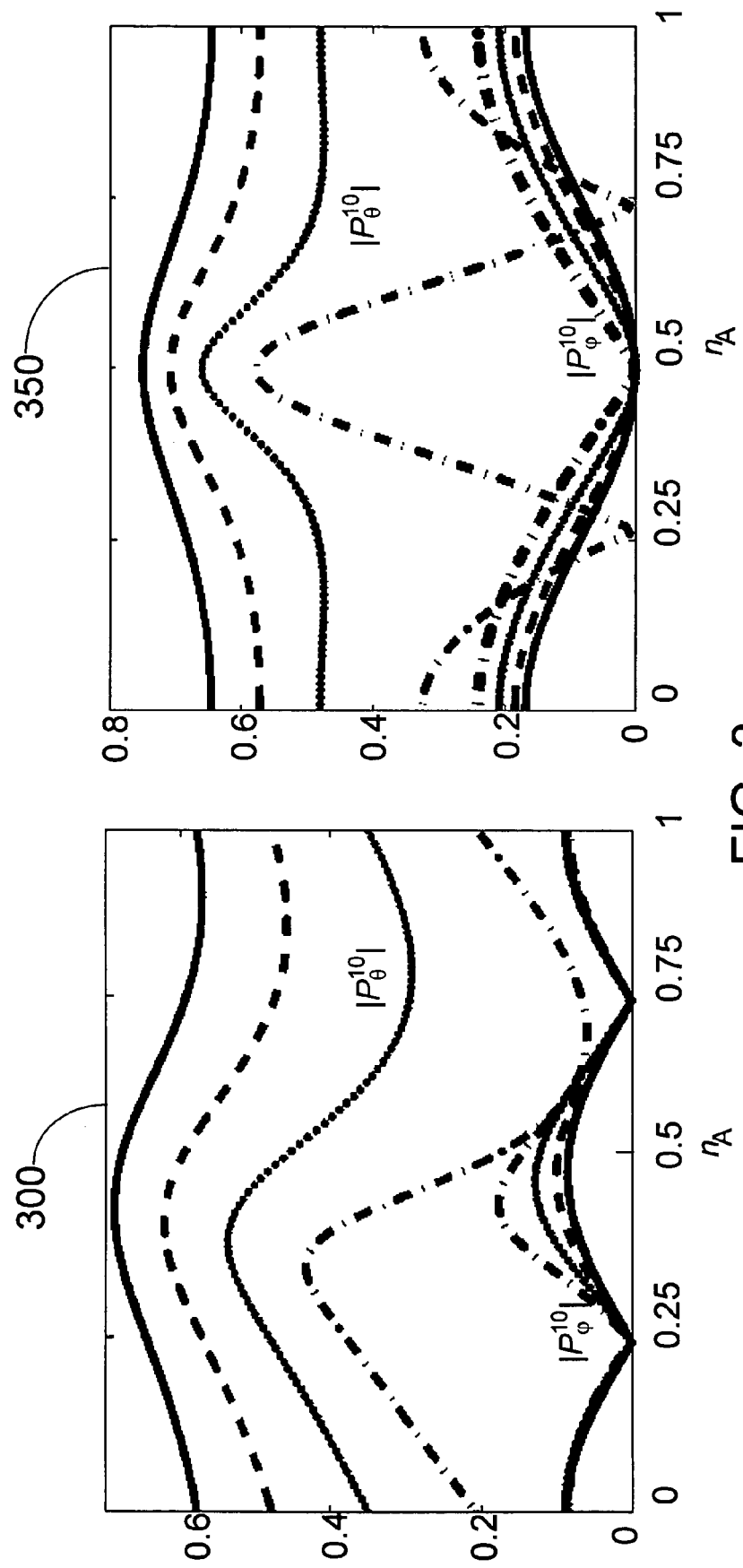
FIG. 3 illustrates the charge values for which a QND measurement can occur in accordance with an embodiment of the present invention.

FIG. 3 shows the result of numerical calculation of $|P_\phi^{10}|$ and $|P_\theta^{10}|$ for different values of $\alpha$. These are plotted versus $n_A$ when $n_B = 0.25$ in graph 300 and $n_B = 0.5$ in graph 350, for a qubit with $E_C/E_J = 0.2$ at $f=0$. In graph 300 the top curves are for $|P_\theta^{10}|$ and the bottom curves show $|P_\phi^{10}|$. The values of $\alpha$ are 0.6 (solid line), 0.7 (dashed line), 0.8 (dotted line), and 0.9 (dash-dot line) for each of the top and bottom set of curves. Likewise, in graph 350 the top curves are for $|P_\theta^{10}|$ and the bottom curves show $|P_\phi^{10}|$. The values of $\alpha$ are 0.6 (solid line), 0.7 (dashed line), 0.8 (dotted line), and 0.9 (dash-dot line) for each of the top and bottom set of curves. When $\alpha$ is small, the wave function of the qubit is localized within a unit cell. As a result, the $|P_\phi^{10}|$ curve agrees very well with equation (17). A larger $a$ delocalizes the states, causing deviation from a simple sinusoidal behavior. When $n_B = 0.25$ (graph 300), $|P_\phi^{10}|$ vanishes at $n_A = 0.25$ ($n_- = 0$) and $n_A = 0.75$ ($n_+ = 1$) in agreement with the above argument. For $n_B = 0.5$ (graph 350) both points coincide at $n_A = 0.5$ ($n_- = 0$ and $n_+ = 1$).

While both points $n_A = n_B$ and $n_A = -n_B$ make $P_\phi^{10} = 0$, only the former is suitable for readout. To see this, notice that the readout measures the expectation values of $\partial H/\partial n_+ = P_\phi/M_\phi$ in $|0,1>$ states. However $$P_\phi^{00} = \sin \pi n_+ [A_{01}^{00} + A_{10}^{00} + (A_{23}^{00} + A_{32}^{00})\sin^2 \pi n_-]$$

$$P_\phi^{11} = \sin \pi n_+ [A_{01}^{11} + A_{10}^{11} + (A_{23}^{11} + A_{32}^{11})\sin^2 \pi n_-]$$

both vanish when $n_+ = 0$ ($n_A = -n_B$), resulting in an indistinguishable (zero) output. Thus the point to readout the qubit is at $n_- = 0$. The difference in the output between the two states is then proportional to $$P_\phi^{11} - P_\phi^{00} = \sin \pi n_+ [A_{01}^{11} + A_{10}^{11} - A_{01}^{00} - A_{10}^{00}] \quad (19)$$

which vanishes when $n_+$ is an integer.

Figure 4:
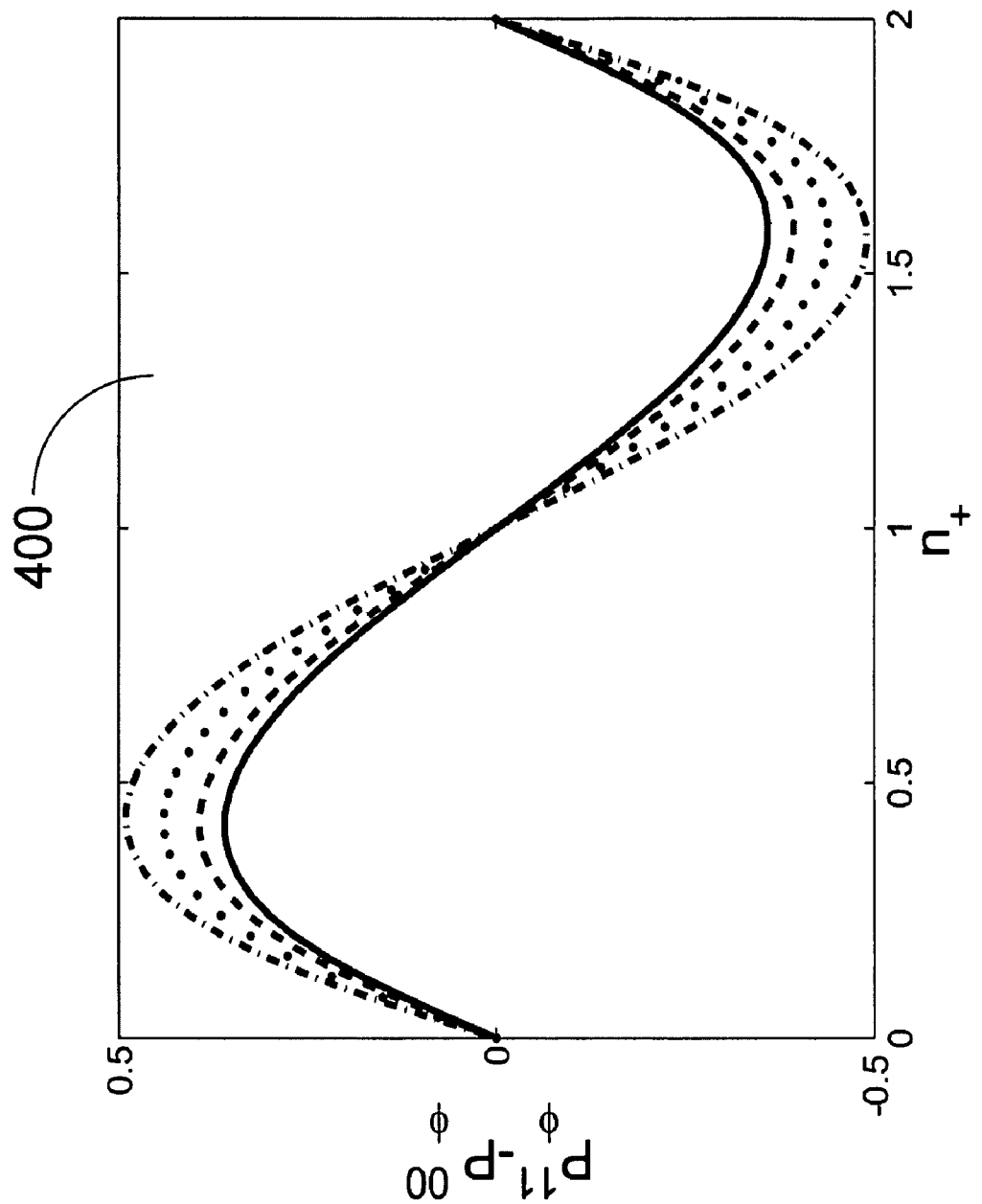
FIG. 4 illustrates the magnitude of output versus charge of a QND measurement in accordance with an embodiment of the present invention.

FIG. 4 displays the result of numerical calculation of $P_\phi^{11} - P_\phi^{00}$ for different values of $\alpha$, for the same system as in FIG. 3. The graph 400 is $P_\phi^{11} - P_\phi^{00}$ vs $n_+$ while $n_- = 0$ ($n_A = n_B$). Different lines correspond to different $\alpha$ in the way described for FIG. 3. The sinusoidal behavior, in agreement with equation (19), is evident from FIG. 3. The maximum output is achieved when $n_+ \approx 0.5$ or $n_A = n_B \approx 0.25$, i.e., a symmetrical (charge) bias point. In an embodiment of the present invention a symmetric biasing point is where the charge on a first island of a superconducting qubit and the second island of a superconducting qubit are tuned to be equal. In another embodiment of the present invention a symmetric biasing point is where the normalized gate charges sum to about one half. Normalized gate charges are defined immediately above equation (1). The term about in relation to normalize gate charges means a tolerance with 40% of stated term.

To summarize, this example shows mathematically that QND measurement of a three Josephson junction flux qubit is possible if both island charges are measured symmetrically at a symmetric biasing point. In an embodiment of the present invention, the qubit operates in the hybrid charge-flux regime. See, for example, United States Patent Publication No. US 2005/0082519 A1 entitled "Superconducting Phase-Charge Qubits," and www.arXiv.org: cond-mat/0311220, both of which are hereby incorporated by reference in their entireties. QND readout allows long readout time with high fidelity, and small coupling to the qubit to prevent decoherence due to the interaction with the readout mechanism during quantum operation.

EXAMPLE 2

Mathematical Example of Quantum Nondemolition Charge Measurement of a Qubit Using Operator Notation Embodiments of the present invention can be described in terms of operator notation. That is, a qubit such as the qubit shown in FIGS. 1 and 5 can be described in mathematical language in more complete accordance with the principles of quantum mechanics than that language used in Example 1. The results of the calculations of each example are similar and in some embodiments are the same. See, Amin, 2005, Physical Review B 71, 140505(R); arXiv.org: cond-mat/0412286v1 (Mon., Dec. 13, 2004); and arXiv.org: cond-mat/0412286v2 (Thu., Mar. 10, 2005), each of which are hereby incorporated by reference in its entirety

EXAMPLE 3

Mathematical Example of Quantum Nondemolition Charge Measurement of a Charge Qubit None of the above arguments depended on the qubit's regime of operation, although Example 1 mainly focused on the flux regime. Known restrictions independently include: the qubit island voltages should not be too small to be detectable by the SET, or rf-SET; and the qubit should not be too far in the flux regime. The scheme works when the qubit is in the charge regime (where the charging energy exceeds the Josephson energy). The qubit wave function in the charge basis can be written as $|n_A, n_B\rangle$, where $n_A$ and $n_B$ are the number of Cooper pairs on the two islands (H and δH are easily obtained by replacing $P_\phi$ and $P_\theta$ with $n_A+n_B$, and $n_A-n_B$, respectively). When $n_{gA}=n_{gB}$ (that is when $n_-=0$), the states $|n,n+1\rangle$ and $|n+1,n\rangle$ will be degenerate. The presence of the Josephson term of the third junction will remove this degeneracy, making the rotated states $|n, \pm\rangle = (|n,n+1\rangle \pm |n+1, n\rangle)/2^{1/2}$ preferred basis for the qubit. In the Hamiltonian matrix, $|n,+\rangle$ has nonzero off-diagonal matrix elements with other charge states and hence will mix after complete diagonalization. The matrix elements of $|n,-\rangle$ with other states, however, are all zero as long as $E_{J1}=E_{J2}$. In fact, $|n,-\rangle$ is an eigenstate of the qubit Hamiltonian, as well as an eigenvector of δH if $\delta n_A - \delta n_B = 0$. Thus, δH will not mix $|n,-\rangle$ with any other states. It is straightforward to show that, for all values of $n_+$, one of the two lowest energy levels of the qubit will be a $|n,-\rangle$ state (with an appropriate value of n depending on $n_+$), hence $<1|\delta H|0>=0$. Embodiments of the present invention function independently of whether the qubit are in the charge or hybrid regime. Therefore, when a phase-charge qubit is recited herein, it may be in the hybrid regime or charge regime.

Examples 1, 2, and 3, and the description above, show that QND measurement of a qubit (e.g, a three-Josephson-junction) is possible if both island charges are measured symmetrically at a symmetric biasing point. The scheme is applicable for a wide range of parameters from charge to flux regime as long as charge measurement is possible. A QND readout allows a long readout time with high fidelity and small qubit-detector coupling to prevent decoherence due to the interaction with the measurement device during quantum operation. It also makes it possible to operate the SET in the quasiparticle branch benefiting from larger charge sensitivity.

CONCLUSION AND REFERENCES CITED

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed:

1. A device comprising:
a plurality of qubits, wherein each qubit in said plurality of qubits comprises a superconducting loop interrupted by a plurality of Josephson junctions, each Josephson junction in said plurality of Josephson junctions interrupting a different portion of the superconducting loop and each different adjacent pair of Josephson junctions in said plurality of Josephson junctions defining a different superconducting island in a plurality of superconducting islands in said superconducting loop, the plurality of superconducting islands including a first superconducting island and a second superconducting island;
a first capacitance;
a second capacitance; and
a plurality of readout mechanisms,
wherein:
said first and second superconducting island of each respective qubit in said plurality of qubits is coupled to a corresponding readout mechanism in said plurality of readout mechanisms such that the corresponding readout mechanism applies an equal and symmetrically canceling back-action to said first island and said second island; and
a first qubit and a second qubit in said plurality of qubits are coupled to each other by said first capacitance and said second capacitance, wherein
the first capacitance couples the first island of the first qubit and second qubit; and
the second capacitance couples the second island of the first qubit and second qubit.

2. A device comprising:
a plurality of qubits, wherein each respective qubit in said plurality of qubits comprises a superconducting loop interrupted by a plurality of Josephson junctions, each Josephson junction in said plurality of Josephson junctions interrupting a different portion of the superconducting loop and each different adjacent pair of Josephson junctions in said plurality of Josephson junctions defining a different superconducting island in a plurality of superconducting islands in said superconducting loop, the plurality of superconducting islands comprising a first subset of islands and a second subset of islands; and
a plurality of capacitances; and
a plurality of readout mechanisms, wherein
each respective island in said second subset of islands in each respective qubit in said plurality of qubits is capacitively coupled to a corresponding readout mechanism in said plurality of readout mechanisms by a corresponding capacitance in said plurality of capacitances.

3. The device of claim 2, wherein a first readout mechanism in the plurality of readout mechanisms comprises an electrometer.

4. The device of claim 3, wherein said electrometer comprises an rf-SET.

5. The device of claim 2, wherein said second subset of islands in a first qubit in said plurality of qubits comprises:
a first island that is coupled to a first gate charge mechanism for tuning a gate charge on said first island; and
a second island that is coupled to a second gate charge mechanism for tuning a gate charge on said second island.

6. The device of claim 5, wherein said first gate charge mechanism and said second gate charge mechanism are configured to tune the gate charge of said first island and said second island to an equal or approximately equal value.

7. The device of claim 2, wherein a readout mechanism in said plurality of readout mechanisms is configured to apply an equal back-action charge to a first island and a second island in said second subset of islands of a qubit in said plurality of qubits.

8. The device of claim 7, wherein said equal back-action charge is symmetrically canceled out on said corresponding qubit.

9. The device of claim 2, wherein
said second subset of islands of a qubit in said plurality of qubits comprises a first island and a second island; wherein
said first island is capacitively coupled to a first readout mechanism in said plurality of readout mechanisms by a first capacitance in said plurality of capacitances; and
said second island is capacitively coupled to said first readout mechanism in said plurality of readout mechanisms by a second capacitance in said plurality of capacitances.

10. The device of claim 9, wherein said first capacitance and second capacitance are approximately equal.

11. The device of claim 9, wherein said first capacitance and said second capacitance are each independently between 1 attofarad and 1 picofarad.

12. The device of claim 9, wherein said first capacitance is within a tolerance of said second capacitance.

13. The device of claim 12, wherein said tolerance is about ±0.1 femtofarads.

14. The device of claim 12, wherein said tolerance is about ±1 attofarads.

15. The device of claim 12, wherein said tolerance causes a relaxation time due to operation of said first readout mechanism to be less than or approximately equal to an intrinsic relaxation time of said qubit.

16. The device of claim 2, wherein at least one qubit in said plurality of qubits is a phase-charge qubit or a charge qubit.

17. A device comprising:
a plurality of qubits, wherein each qubit in said plurality of qubits comprises a superconducting loop interrupted by a plurality of Josephson junctions, each Josephson junction in said plurality of Josephson junctions interrupting a different portion of the superconducting loop and each different adjacent pair of Josephson junctions in said plurality of Josephson junctions defining a different superconducting island in a plurality of superconducting islands in said superconducting loop, the plurality of superconducting islands including a first superconducting island and a second superconducting island;
wherein:
a first qubit and a second qubit in said plurality of qubits are coupled to each other by a first capacitance and a second capacitance, wherein
the first capacitance couples the first island of the first qubit to the first island of the second qubit; and
the second capacitance couples the second island of the first qubit to the second island of the second qubit.

18. The device of claim 17, wherein the coupling between said first qubit and said second qubit is diagonal in the basis of the plurality of qubits.

19. The device of claim 17, wherein the first capacitance is between about 0.01 femtofarads and about 2 femtofarads.

20. The device of claim 17, wherein:
the first island of the first qubit is capacitively coupled to a first island of a third qubit in said plurality of qubits; and
the second island of the first qubit is capacitively coupled to a second island of the third qubit.

* * * * *